US012721102B2

(12) United States Patent
Kwon et al.

(10) Patent No.: US 12,721,102 B2
(45) Date of Patent: Aug. 25, 2026

(54) CRYOGENIC ELECTROSTATIC CHUCK SYSTEM AND METHOD FOR CONTROLLING SAME

(71) Applicant: KWANGWOON UNIVERSITY INDUSTRY-ACADEMIC COLLABORATION FOUNDATION, Seoul (KR)

(72) Inventors: Gi Chung Kwon, Seongnam-si (KR); Hee Tae Kwon, Bucheon-si (KR); Ji Hwan Kim, Goyang-si (KR); Woo Jae Kim, Gimpo-si (KR); In Young Bang, Seoul (KR)

(73) Assignee: KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 218 days.

(21) Appl. No.: 18/700,681

(22) PCT Filed: Nov. 15, 2021

(86) PCT No.: PCT/KR2021/016610
§ 371 (c)(1),
(2) Date: Apr. 11, 2024

(87) PCT Pub. No.: WO2023/063474
PCT Pub. Date: Apr. 20, 2023

(65) Prior Publication Data

US 2025/0006538 A1 Jan. 2, 2025

(30) Foreign Application Priority Data

Oct. 15, 2021 (KR) ........................ 10-2021-0137797

(51) Int. Cl.
*H01T 23/00* (2006.01)
*H01J 37/32* (2006.01)
*H10P 72/72* (2026.01)

(52) U.S. Cl.
CPC ...... *H10P 72/722* (2026.01); *H01J 37/32724* (2013.01); *H01J 2237/002* (2013.01); *H01J 2237/2007* (2013.01)

(58) Field of Classification Search
IPC .................................................... H01L 21/6833
See application file for complete search history.

(56) References Cited

U.S. PATENT DOCUMENTS 8,075,729 B2 * 12/2011 Holland .............. H01L 21/6831 118/724
2009/0159590 A1 * 6/2009 Yonekura .......... H01L 21/67109 219/520

(Continued)

FOREIGN PATENT DOCUMENTS

JP 6-112302 A 4/1994
JP 6-252093 A 9/1994

(Continued)

OTHER PUBLICATIONS

International Search Report for PCT/KR2021/016610 by Korean Intellectual Property Office dated Jul. 13, 2022.

(Continued)

*Primary Examiner* — Stephen W Jackson
(74) *Attorney, Agent, or Firm* — BROADVIEW IP LAW, PC

(57) ABSTRACT

A cryogenic electrostatic chuck system and a method for controlling the same according to a preferred embodiment of the present invention is capable of performing a cryogenic process for a substrate, such as a cryogenic etching process and a cryogenic deposition process, even in a cryogenic (Continued)

range, and is capable of implementing a vertical etch profile, which is ideal for feature etching, with a high aspect ratio.

11 Claims, 13 Drawing Sheets

(56) References Cited

U.S. PATENT DOCUMENTS

| | | | | |
|---|---|---|---|---|
| 2020/0395197 | A1* | 12/2020 | Garcia De Gorordo | H01L 21/6833 |
| 2024/0304487 | A1* | 9/2024 | Kwon | H01L 21/67248 |

FOREIGN PATENT DOCUMENTS

| | | | |
|---|---|---|---|
| JP | 2001-110885 | A | 4/2001 |
| JP | 2002-9064 | A | 1/2002 |
| JP | 2009-152475 | A | 7/2009 |
| JP | 2018-6768 | A | 1/2018 |
| JP | 2019-201087 | A | 11/2019 |
| JP | 2021-57522 | A | 4/2021 |
| JP | 2021-158334 | A | 10/2021 |
| KR | 10-0346587 | B1 | 8/2002 |
| KR | 2002-0085359 | A | 11/2002 |
| KR | 10-2015-0094685 | A | 8/2015 |
| KR | 10-1575505 | B1 | 12/2015 |
| KR | 10-2017-0110025 | A | 10/2017 |
| WO | 2018/038044 | A1 | 3/2018 |
| WO | 2020/185467 | A1 | 9/2020 |
| WO | 2021/055134 | A1 | 3/2021 |

OTHER PUBLICATIONS

Office Action for JP 2024-522427 by Japan Patent Office dated Mar. 11, 2025.

* cited by examiner

CRYOGENIC ELECTROSTATIC CHUCK SYSTEM AND METHOD FOR CONTROLLING SAME

CROSS-REFERENCE TO RELATED APPLICATIONS

This application is a National Phase Entry Application of PCT Application No. PCT/KR2021/016610, filed on Nov. 15, 2021, which claims priority to Korean Patent Application No. 10-2021-0137797, filed on Oct. 15, 2021, in the Korean Intellectual Property Office, the entire contents of which are hereby incorporated by reference in its entirety.

TECHNICAL FIELD

The present invention relates to a cryogenic electrostatic chuck system and a method for controlling the same, and more particularly, to a system and a control method of an electrostatic chuck (ESC) used for a semiconductor manufacturing process.

This study is related to the study (No. 1415173011) on the cryogenic device technology for an insulator etching process conducted by Kwangwoon University with the support of the Korea Institute of Evaluation and Management of Industrial Technology with funding from the Ministry of Trade, Industry and Energy from 2020 to 2022.

BACKGROUND ART

In order to hold a substrate for a semiconductor manufacturing process, such as a wafer, and achieve a temperature and a temperature uniformity and etch a feature in the substrate, an electrostatic chuck ESC is used in a device for the semiconductor etching and manufacturing process. In accordance with the improvement of a performance of a semiconductor device, such as a 3D NAND and a DRAM, an aspect ratio of a feature in the device for the semiconductor etching and manufacturing process is consistently increased to a high aspect ratio.

However, the electrostatic chuck is manufactured to be operable mainly in a room temperature range (for example, 40° C. or 60° C.). For example, the electrostatic chuck of the related art is configured by a chuck ceramic formed of a dielectric material, such as alumina ($Al_2O_3$) having a coefficient of thermal expansion (CTE) of approximately $8*10^{-6}$/° C. or aluminum nitride (AlN) having a coefficient of thermal expansion (CTE) of approximately $4*10^{-6}$/° C. and a chuck body formed of aluminum (Al) having a coefficient of thermal expansion (CTE) of approximately $24*10^{-6}$/° C. When the electrostatic chuck is operated at a cryogenic range, an expansion/shrinkage rate of aluminum AL is three times faster than that of alumina ($Al_2O_3$), which causes breakage of the electrostatic chuck of the related art. Further, in order to achieve a temperature and a temperature uniformity of a substrate and an electrostatic chuck in a cryogenic range, the electrostatic chuck of the related art uses a device such as a cryogenic chiller. Even though a manufacturing process (for example, an etching process) is performed by achieving the temperature and the temperature uniformity of the substrate and the electrostatic chuck in the cryogenic range using the device, such as a cryogenic chiller, a substrate transfer or loading for a next manufacturing process is necessary. That is, when the substrate is transferred, the temperature and the temperature uniformity in the cryogenic range need to be the room temperature range again. As a result, the substrate transfer is one of factors related to the productivity so that temperature control in a short distance from the electrostatic chuck is necessary, rather than the temperature control using a device such as a cryogenic chiller of the related art located far from the electrostatic chuck. Further, during the etching with a high aspect ratio using the electrostatic chuck in the room temperature range in the related art, degradation of an etching profile of the feature, such as bowing or clogging, is caused.

In order to overcome the above-mentioned problem, a cryogenic etching technique is currently being developed. However, during the operation in the cryogenic range for the cryogenic etch using the electrostatic chuck of the related art which is manufactured to be operable in the room temperature range, the coefficient of thermal expansion of the chuck body is much larger than that of the chuck ceramic in the electrostatic chuck of the related art which is configured by the chuck ceramic and the chuck body so that the electrostatic chuck is broken. For example, there are problems in that the chuck ceramic is peeled off from the chuck body and the chuck ceramic is broken. Accordingly, in order to perform a robust cryogenic etching process of the feature, an electrostatic chuck technique which is capable of maintaining and controlling the cryogenic temperature and the temperature uniformity of the substrate is demanded.

DISCLOSURE

Technical Problem

An object to be achieved by the present invention is to provide a cryogenic electrostatic chuck and a method for controlling the same which are capable of performing a cryogenic process of a substrate, such as a cryogenic etching process and a cryogenic deposition process even in the cryogenic range.

Other and further objects of the present invention which are not specifically described can be further considered within the scope easily deduced from the following detailed description and the effect.

Technical Solution

In order to achieve the above-described object, according to a preferred embodiment of the present invention, a cryogenic electrostatic chuck device includes a substrate holder which fixes a substrate by an electrostatic force; and a body which is disposed below the substrate holder and includes a thermal conductivity adjustment channel which is formed of a metal based material determined based on a coefficient of thermal expansion (CTE) of the substrate holder and adjusts a thermal conductivity based on a pressure formed by a thermal conductivity adjustment gas supplied by an adjustment gas supply unit.

Here, the thermal conductivity adjustment channel includes a plurality of thermal conductivity adjustment sub channels and a thermal conductivity is adjusted for every thermal conductivity adjustment sub channel based on a pressure formed by the thermal conductivity adjustment gas supplied to the plurality of thermal conductivity adjustment sub channels by the adjustment gas supply unit.

Here, the thermal conductivity adjustment channel includes a plurality of thermal conductivity adjustment sub channels which is spaced apart from each other with a partition therebetween and the thermal conductivity adjustment gas is supplied for every thermal conductivity adjustment sub channel by the adjustment gas supply unit.

Here, the thermal conductivity adjustment channel includes a first thermal conductivity adjustment sub channel and a second thermal conductivity adjustment sub channel which are spaced apart from each other with a partition therebetween and the first thermal conductivity adjustment sub channel is formed with a donut shape, and the second thermal conductivity adjustment sub channel is formed with a circular shape which is spaced apart from the inside of the first thermal conductivity adjustment sub channel with the partition therebetween.

Here, a diameter of the first thermal conductivity adjustment sub channel is between 200 mm and 330 mm, a diameter of the second thermal conductivity adjustment sub channel is between 150 mm and 250 mm, and a diameter of the partition is between 1 mm and 10 mm.

Here, the thermal conductivity adjustment channel includes a plurality of thermal conductivity adjustment sub channels having different thicknesses.

Here, the thermal conductivity adjustment channel includes a first thermal conductivity adjustment sub channel and a second thermal conductivity adjustment sub channel which are spaced apart from each other with a partition therebetween and the first thermal conductivity adjustment sub channel is formed with a donut shape, and the second thermal conductivity adjustment sub channel has a thickness larger than the thickness of the first thermal conductivity adjustment sub channel and is formed with a circular shape which is spaced apart from the inside of the first thermal conductivity adjustment sub channel with the partition therebetween.

Here, the thermal conductivity adjustment channel includes a plurality of thermal conductivity adjustment sub channels which is connected to each other by means of a connection pipe with an orifice shape.

Here, the thermal conductivity adjustment channel includes a first thermal conductivity adjustment sub channel disposed on a refrigerant channel and a second thermal conductivity adjustment sub channel which extends from an outer end of a first thermal conductivity adjustment sub channel to the refrigerant channel to be spaced apart from the outside of the refrigerant channel.

Here, a diameter of the substrate holder is equal to or smaller than a diameter of the substrate and a diameter of the body is equal to or larger than a diameter of the substrate.

Here, the cryogenic electrostatic chuck device further includes an upper bonding unit which is located between the substrate holder and the body and bonds the substrate holder and the body; and a lower bonding unit which is located below the body to be bonded to the body.

Here, the metal based material may be a metal matrix composite (MMC) which is one of Al—SiC and Al—Si.

In order to achieve the above-described object, according to a preferred embodiment of the present invention, a method for controlling a cryogenic electrostatic chuck device including a substrate holder which fixes a substrate by an electrostatic force; and a body which is disposed below the substrate holder and includes a thermal conductivity adjustment channel which is formed of a metal based material determined based on a coefficient of thermal expansion (CTE) of the substrate holder and adjusts a thermal conductivity based on a pressure formed by a thermal conductivity adjustment gas supplied by an adjustment gas supply unit, includes: a step of measuring a temperature of the substrate holder, a temperature uniformity of the substrate holder, a temperature on the thermal conductivity adjustment channel, and a temperature uniformity on the thermal conductivity adjustment channel; and a step of adjusting an amount and/or a pressure of the thermal conductivity adjustment gas supplied to the thermal conductivity adjustment channel by the adjustment gas supply unit, based on a thermal conductivity graph according to a pressure, a target temperature, and a target temperature uniformity.

Advantageous Effects

According to a cryogenic electrostatic chuck according to an exemplary embodiment of the present invention and a method for controlling the same, a cryogenic process for a substrate, such as a cryogenic etching process and a cryogenic deposition process, may be performed even in the cryogenic range.

Further, according to the present invention, a vertical etch profile which is ideal for feature etching with a high aspect ratio may be implemented.

The effects of the present disclosure are not limited to the technical effects mentioned above, and other effects which are not mentioned can be clearly understood by those skilled in the art from the following description

DESCRIPTION OF DRAWINGS

FIG. 2 is a block diagram for explaining a detailed configuration of a cryogenic electrostatic chuck device illustrated in FIG. 1.

FIG. 3 is a view for explaining Example 1 of a cryogenic electrostatic chuck device illustrated in FIG. 2.

FIG. 4 is a view for explaining Example 2 of a cryogenic electrostatic chuck device illustrated in FIG. 2.

FIG. 5 is a view for explaining Example 3 of a cryogenic electrostatic chuck device illustrated in FIG. 2.

FIG. 6 is a view for explaining Example 4 of a cryogenic electrostatic chuck device illustrated in FIG. 2.

FIG. 7 is a view for explaining Example 5 of a cryogenic electrostatic chuck device illustrated in FIG. 2.

FIG. 8 is a view for explaining Example 6 of a cryogenic electrostatic chuck device illustrated in FIG. 2.

FIG. 9 is a view for explaining Example 7 of a cryogenic electrostatic chuck device illustrated in FIG. 2.

FIG. 10 is a view for explaining another example of an RF power supply configuration of a cryogenic electrostatic chuck device illustrated in FIG. 2.

MODE FOR CARRYING OUT THE DISCLOSURE

Figure 1:
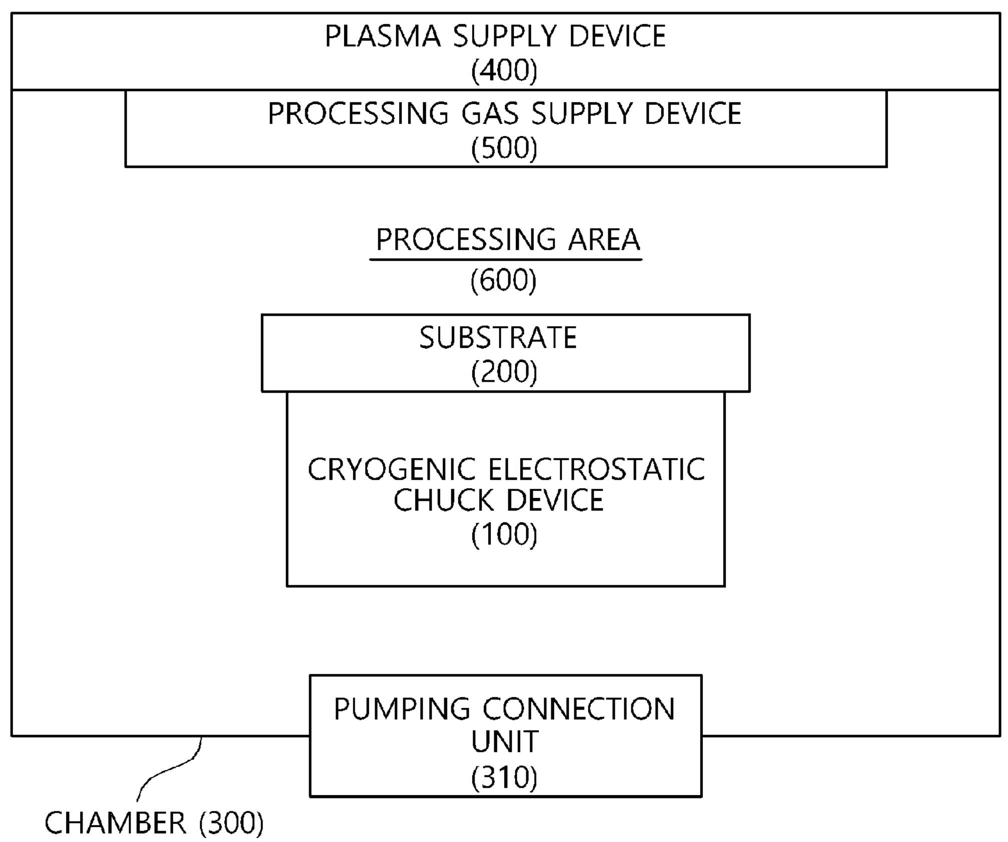
FIG. 1 is a block diagram for explaining a cryogenic electrostatic chuck system according to a preferred embodiment of the present invention.

Hereinafter, embodiments of the present invention will be described in detail with reference to the accompanying drawings. Advantages and characteristics of the present invention and a method of achieving the advantages and characteristics will be clear by referring to preferable embodiments described below in detail together with the accompanying drawings. However, the present disclosure is not limited to exemplary embodiments disclosed herein but will be implemented in various different forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims. Like reference numerals generally denote like elements throughout the specification.

Unless otherwise defined, all terms (including technical and scientific terms) used in the present specification may be used as the meaning which may be commonly understood by the person with ordinary skill in the art, to which the present invention belongs. It will be further understood that terms defined in commonly used dictionaries should not be interpreted in an idealized or excessive sense unless expressly and specifically defined.

In the specification, the terms "first" or "second" are used to distinguish one component from the other component so that the scope should not be limited by these terms. For example, a first component may be referred to as a second component, and similarly, a second component may be referred to as a first component.

In the present specification, in each step, numerical symbols (for example, a, b, and c) are used for the convenience of description, but do not explain the order of the steps so that unless the context apparently indicates a specific order, the order may be different from the order described in the specification. In the present specification, in each step, numerical symbols (for example, a, b, and c) are used for the convenience of description, but do not explain the order of the steps so that unless the context apparently indicates a specific order, the order may be different from the order described in the specification.

In this specification, the terms "have", "may have", "include", or "may include" represent the presence of the characteristic (for example, a numerical value, a function, an operation, or a component such as a part"), but do not exclude the presence of additional characteristic.

The term "~unit" used in the specification refers to a software or hardware component such as a field programmable gate array (FPGA) or an ASIC and "~unit" performs some functions. However, "~unit" is not limited to the software or the hardware. "~unit" may be configured to be in an addressable storage medium or may be configured to reproduce one or more processors. Accordingly, as an example, "~unit" includes components such as software components, object oriented software components, class components, and task components, processes, functions, attributes, procedures, subroutines, segments of a program code, drivers, a firmware, a microcode, a circuit, data, database, and data structures. A function which is provided in the components and "~units" may be combined with a smaller number of components and "~units" or divided into additional components and "~units".

Hereinafter, a preferred embodiment of a cryogenic electrostatic chuck system and a method for controlling the same according to the present invention will be described in detail with reference to the accompanying drawings.

First, a cryogenic electrostatic chuck system according to a preferred embodiment of the present invention will be described with reference to FIG. 1.

FIG. 1 is a block diagram for explaining a cryogenic electrostatic chuck system according to a preferred embodiment of the present invention.

Referring to FIG. 1, a cryogenic electrostatic chuck system 10 according to a preferred embodiment of the present invention is an electrostatic chuck system which performs a cryogenic process for a substrate 200, such as a cryogenic etching process or a cryogenic deposition process even in a cryogenic range.

Here, the cryogenic range according to the present invention is −20° C. to −150° C., and desirably, −40° C. to −150° C.

That is, the cryogenic electrostatic chuck system 10 may use a metal based material having a characteristic of a low coefficient of thermal expansion (for example, $7*10^{-6}$/° C.) which is close to or less different from the coefficient of thermal expansion (CTE) of the chuck ceramic, rather than aluminum (Al) which is used as a material for a chuck body of the electrostatic chuck of the related art, as a material for the chuck body, for the robust electrostatic chuck (ESC) operation (for example, electrostatic chuck breakage prevention) in the cryogenic range.

Further, the cryogenic electrostatic chuck system 10 according to the present invention may include a thermal conductivity adjustment configuration formed of a metal-based material in the chuck body to maintain and control a temperature and a temperature uniformity for improving a productivity (for example, substrate transfer) and performing a robust feature cryogenic etching process.

Accordingly, the cryogenic process (for example, the cryogenic etching process and a cryogenic deposition process) for the substrate 200 in the semiconductor manufacturing process may be performed using the cryogenic electrostatic chuck system 10 according to the present invention. When the cryogenic etching process is performed using the present invention, an ideal vertical etch profile may be implemented by etching the feature with a high aspect ratio.

To this end, the cryogenic electrostatic chuck system 10 includes a cryogenic electrostatic chuck device 100, a chamber 300, a plasma supply device 400, and a processing gas supplying device 500.

The cryogenic electrostatic device 100 fixes and supports the position of the substrate 200 by electrostatic force and controls the temperature and the temperature uniformity of the substrate 200.

Here, the diameter of the substrate may be 200 mm or 300 mm and the substrate may include wafer and glass.

Specifically, the cryogenic electrostatic chuck device 100 according to the present invention uses a metal-based material having a low coefficient of thermal expansion which is close to or is less different from a coefficient of thermal expansion of the chuck ceramic, as the material for the chuck body, to achieve a robust electrostatic chuck operation in the cryogenic range.

Further, the cryogenic electrostatic chuck device 100 according to the present invention includes a thermal conductivity adjustment configuration formed of a metal based material in the chuck body to maintain and control the temperature and the temperature uniformity of the substrate, thereby improving the productivity and performing the cryogenic etching process for the robust feature The chamber 300 isolates the cryogenic electrostatic chuck device 100 from the external environment (for example, atmospheric environment) to create a processing area 600 in a vacuum (for example, 10 mTorr or $10^{-6}$ Torr) environment.

Further, the chamber 300 includes openings which are formed in parts coupled to a pumping connection unit 310 connected to a vacuum system (not illustrated) and a plasma supplying device 400. Openings coupled to the pumping connection unit 310 and the plasma supplying device 400 may have different sizes.

The vacuum system connected to the pumping connection unit 310 may include a high vacuum pump such as a turbo-molecular pump, a low vacuum pump such as a dry pump, and various valves.

The plasma supplying device 400 is coupled to an opening part formed in the chamber 300 and may be a reactive ion etch (RIE) device such as a flat type capacitively coupled plasma (CCP) source, a coil based antenna type inductively coupled plasma (ICP) source, or an electron cyclotron resonance (ECR).

The processing gas supplying device 500 is coupled to the plasma supplying device 400 to inject a processing gas or a process gas through an injection port in the form of a nozzle or a showerhead.

At this time, the processing gas supplying device 500 is configured by a single zone or a multi-zone to uniformly inject the processing gas or the process gas to the processing area 600. The processing gas supplying device 500 is configured together with a supply source of the processing gas or the process gas, such as a gas cylinder or a gas cabinet and an integrated gas system.

Now, a cryogenic electrostatic chuck device according to a preferred embodiment of the present invention will be described in more detail with reference to FIG. 2.

Figure 2:
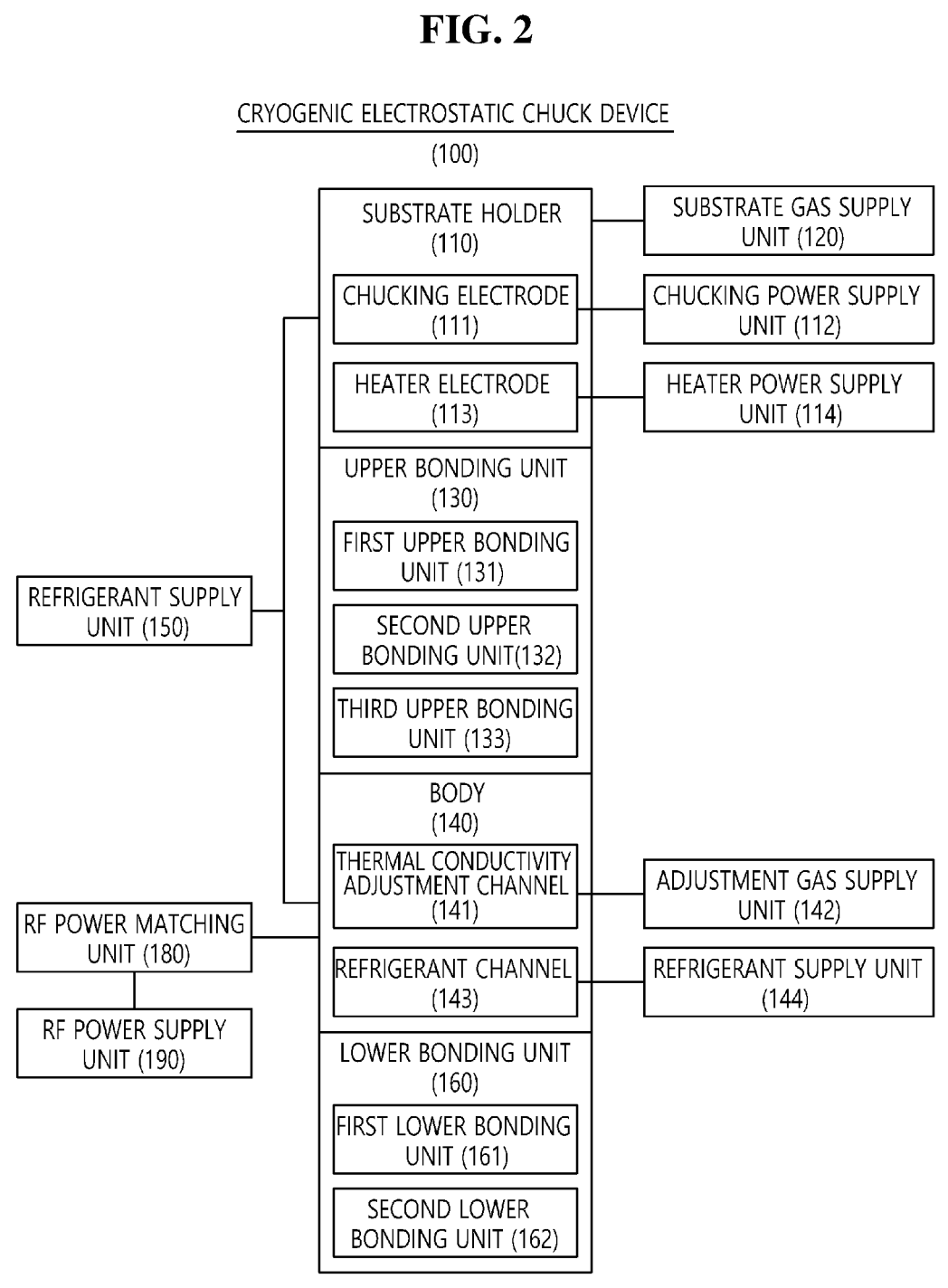

FIG. 2 is a block diagram for explaining a detailed configuration of a cryogenic electrostatic chuck device illustrated in FIG. 1.

Referring to FIG. 2, the cryogenic electrostatic chuck device 100 according to a preferred embodiment of the present disclosure includes a substrate holder 110, an upper bonding unit 130, a body 140, a lower bonding unit 160, and a controller (not illustrated).

The substrate holder 110 fixes the substrate 200 by an electrostatic force.

That is, the substrate holder 110 fixes the position of the substrate 200 and supports the substrate 200 using the electric force and controls the temperature and the temperature uniformity of the substrate 200, simultaneously.

At this time, the substrate holder 110 is formed of a dielectric material. The dielectric material may be alumina ($Al_2O_3$) or aluminum nitride (AlN).

Here, the electric force may be classified into coulomb force and Johnsen-Rahbek force depending on a volume resistivity of the substrate supporter 110 configured by the dielectric material. For example, when the volume resistivity is $10^{16}$ Ω·cm or $10^{14}$ Ω·cm or higher, if a direct current (DC) or alternative current (AC) power is applied to the chucking electrode 111 through the chucking power supply unit 112, the substrate holder 110 fixes the position of the substrate 200 and supports the substrate 200 with the coulomb force generated by the voltage drop in the dielectric material. Further, when the volume resistivity is $10^{16}$ Ω·cm or $10^{14}$ Ω·cm or higher, a surface roughness (Ra) of a surface of the support holder 110 which is in contact with the substrate 200 is smaller (for example, 0.3 μm) than that of the volume resistivity of $10^{12}$ Ω·cm or $10^{10}$ Ω·cm or lower. In contrast, when the volume resistivity is $10^{12}$ Ω·cm or $10^{10}$ Ω·cm or lower, if a direct current (DC) or alternative current (AC) power is applied to the chucking electrode 111 through the chucking power supply unit 112, the substrate holder 10 fixes the position of the substrate 200 and supports the substrate 200 with the Johnsen-Rahbek force generated by the gap voltage excluding a surface of the dielectric material which is in contact with the substrate 200. Further, when the volume resistivity is $10^{12}$ Ω·cm or $10^{10}$ Ω·cm or lower, a surface roughness of a surface of the support holder 110 which is in contact with the substrate 200 is larger (for example, 0.7 μm) than that of the volume resistivity of $10^{16}$ Ω·cm or $10^{14}$ Ω·cm or higher. In contrast, when the volume resistivity is between $10^{16}$ Ω·cm or $10^{14}$ Ω·cm and $10^{12}$ Ω·cm or $10^{10}$ Ω·cm, as the force for fixing the position of the substrate 200 and supporting the substrate 200, the coulomb force and the Johnson Rahbek force described above are mixed.

Further, in order to achieve the substrate 200 in the cryogenic range, the substrate holder 110 has a volume resistivity in a low resistance range ($10^{12}$ Ω·cm or $10^{10}$ Ω·cm or lower) as a volume resistivity at the room temperature in consideration of the change in the volume resistance of the substrate holder 110 when the temperature changes.

Further, a diameter of the substrate holder 110 may be equal to or smaller than the diameter of the substrate 200. Desirably, the diameter of the substrate holder 110 may be smaller than the diameter of the substrate 200. For example, when the diameter of the substrate 200 is 300 mm, the diameter of the substrate holder 110 may be 300 mm or less (for example, 296 mm to 298 mm).

Further, the thickness of the substrate holder 110 may be 0.3 mm to 10 mm, and desirably, 2.5 mm or 5 mm.

To this end, the substrate holder 110 includes a chucking electrode 111 and a heater electrode 113.

The chucking electrode 111 is buried in the substrate holder 110 and is electrically connected to the chucking power supply unit 112 configured by a filter and a DC or AC power supply device.

Here, the chucking electrode 111 is formed with a specific pattern (for example, a circular shape or a spiral shape) and may be monopolar or bipolar.

The chucking electrode 111 may be formed of a material determined based on characteristics such as a coefficient of thermal expansion and electrical conductivity in the cryogenic range. The material may be metal, such as tungsten (W) or molybdenum (Mo) or an alloy including metal.

Further, the chucking electrode 111 may be disposed above the heater electrode 113.

The heater electrode 113 is buried in the substrate holder 110 and is electrically connected to a heater power supply unit 114 configured by a filter and a DC or AC power supply device.

Here, the heater electrode 113 is formed with a specific pattern (for example, a circular shape or a spiral shape) and may be formed by a single area or a plurality of areas depending on the specific pattern.

The heater electrode 113 may be formed of a material determined based on characteristics such as a coefficient of thermal expansion and electrical conductivity in the cryogenic range. The material may be metal, such as tungsten (W) or molybdenum (Mo) or an alloy including metal.

Further, the heater electrode 113 may be disposed below the chucking electrode 111.

The substrate gas supply unit 120 is configured by a mass flow meter (MFM) and a dumpline and a substrate gas is supplied to an empty space between a surface of the substrate 200 which is in contact with the substrate holder 110 and a surface of the substrate holder 110 which is in contact with the substrate 200 in a specific condition (for example, pressure is 50 Torr, Leakage<1 sccm) to control the temperature and the temperature uniformity of the substrate 200.

Here, the substrate gas may be helium (He) or argon (Ar), and desirably, may be a helium (He).

At this time, the substrate gas supplied through the substrate gas supply unit 120 may be supplied through a gas flow path present in the cryogenic electrostatic device 100, such as the substrate holder 110 and the body 140. Patterns and the number of gas flow paths may be determined based on a zone configuration (a mono zone or multi zone) in the substrate holder 110.

The upper bonding unit 130 is located between the substrate holder 110 and the body 140 and bonds the substrate holder 110 and the body 140 to each other.

That is, the upper bonding unit 130 electrically connects the substrate holder 110 and the body 140 with a low resistance and mechanically bonds the substrate holder 110 and the body 140 to each other.

The upper bonding unit 130 is configured by a first upper bonding unit 131, a second upper bonding unit 132, and a third bonding unit 133. At this time, the first upper bonding unit 131 and the third upper bonding unit 133 of the upper bonding unit 130 are formed using vacuum brazing and epoxy. The first upper bonding unit 131 and/or the third upper bonding unit 133 of the upper bonding unit 130 may be formed using the same method as a method of forming the first lower bonding unit 161 of the lower bonding unit 160 to be described below.

Further, the first upper bonding unit 131 and the third upper bonding unit 133 of the upper bonding unit 130 are formed of a material such as an Al based alloy (for example, Al-10Si-1.5Mg).

The second upper bonding unit 132 of the upper bonding unit 130 is located between the first upper bonding unit 131 and the third upper bonding unit 133.

Here, the second upper bonding unit 132 is formed of material such as molybdenum (Mo), Koval, zirconium (Zr), tungsten (W), titanium (Ti), niobium (Nb), platinum (Pt), or vanadium (V), like the second lower bonding unit 160 of the lower bonding unit 160 to be described below.

Further, the diameter of the second upper bonding unit 132 is equal to or smaller than the diameter of the substrate holder 110 or larger than the diameter of the substrate holder 110. Desirably, the diameter of the second upper bonding unit 132 is equal to the diameter of the substrate holder 110.

Further, the thickness of the second upper bonding unit 132 is determined based on the economic efficiency, and for example, 3 mm, 0.5 mm, and 0.05 mm.

The body 140 is disposed below the substrate holder 110.

At this time, the body 140 may be formed of a metal based material determined based on the coefficient of thermal expansion (CTE) of the substrate holder 110. The metal based material may be a metal matrix composite (MMC) which is one of Al—SiC and Al—Si. The metal matrix composite may be Al—SiC or Al—Si. For example, in the case of Al—SiC, the coefficient of thermal expansion of the metal matrix composite (MMC) generally has a characteristic that the coefficient of thermal expansion of Al—SiC is reduced as SiC wt % is increased. That is, it means that the coefficient of thermal expansion of the body configured by Al—SiC matches the coefficient of thermal expansion of the substrate holder 110 according to wt % SiC. Generally, the range of SiC wt % is generally configured by 15% to 85% and specifically, in the case of the body 140 configured by AlSiC, the wt % SiC of the Al—SiC is more appropriately 65% to 85% for robust operation of the cryogenic electrostatic device 100 in the cryogenic range in consideration of the matching of the coefficient of thermal expansion between the substrate holder 110 and the lower bonding unit 160 bonded by the upper bonding unit 130 and the thermal conductivity. For example, when it is considered that the coefficient of thermal expansion of alumina ($Al_2O_3$) is $7*10^{-6}$ to $8*10^{-6}$/° C., if the matching of the coefficient of thermal expansion of Al-70% SiC and Al-20% SiC is compared, the matching of the coefficient of thermal expansion of Al-70% SiC is better than the matching of the coefficient of thermal expansion of Al-20% SiC. The coefficient of thermal expansion of Al-70% SiC is approximately $7*10^{-6}$/° C. and the coefficient of thermal expansion of Al-20% SiC is approximately $13*10^{-6}$/° C. to $15*10^{-6}$/° C. In contrast, when the metal matrix composite (MMC) is Al—Si, similar to Al—SiC, the coefficient of thermal expansion of the substrate holder 110 matches the coefficient of thermal expansion in accordance with the change of wt % Si, Al—Si is used for the material of the body 140. The body 140 the be formed of metal, such as titanium (Ti) or molybdenum (Mo) or an alloy including the material, rather than the metal matrix composite (MMC).

Further, the body 140 may be manufactured using the metal matrix composite (MMC) using a method, such as casting, infiltration, or additive manufacturing process.

Further, a diameter of the body 140 may be equal to or larger than the diameter of the substrate 200. Desirably, the diameter of the body 140 may be larger than the diameter of the substrate 200. For example, when the diameter of the substrate 200 is 300 mm, the diameter of the body 140 may be 300 mm or larger (for example, 310 mm to 340 mm).

To this end, the body 140 includes a thermal conductivity adjustment channel 141 and a refrigerant channel 143.

The thermal conductivity adjustment channel 141 adjusts the thermal conductivity based on a pressure formed by a thermal conductivity adjustment gas supplied by the adjustment gas supply unit 142.

That is, in order to control the temperature of the substrate holder 110, the temperature uniformity of the substrate holder 110, the temperature of the substrate 200, and the temperature uniformity of the substrate 200, the thermal conductivity adjustment channel 141 is buried in the body 140 formed of the metal matrix composite (MMC) and includes an internal space with the thermal conductivity adjustment gas supplied from the adjustment gas supply unit 142 configured by the mass flow meter (MFM) and the dumpline.

Here, the thermal conductivity adjustment gas may be helium (He) or argon (Ar), and desirably, may be a helium (He).

Further, the thermal conductivity adjustment channel 141 adjusts the thermal conductivity based on a type of the thermal conductivity adjustment gas supplied through the adjustment gas supply unit 142, a pressure (for example, 1 mTorr or lower, 10 mTorr, 20 mTorr, 500 mTorr, 300 Torr, or 760 Torr) of the internal space in which the thermal conductivity adjustment gas supplied through the adjustment gas supply unit 142 is present. Accordingly, the cryogenic electrostatic chuck device 100 according to the present invention controls the temperature of the substrate holder 110, the temperature uniformity of the substrate holder 110, the temperature of the substrate 200, and the temperature uniformity of the substrate 200.

Further, the diameter of the thermal conductivity adjustment channel 141 is equal to or smaller than the diameter of the substrate 200 or larger than the diameter of the substrate 200. Desirably, the diameter of the thermal conductivity adjustment channel 141 may be larger than the diameter of the substrate 200. For example, when the diameter of the substrate 200 is 300 mm, the diameter of the thermal conductivity adjustment channel 141 may be 300 mm or larger (for example, 310 mm to 330 mm).

Further, the thickness of the thermal conductivity adjustment channel 141 may be 0.2 mm or smaller than 0.2 mm. For example, the thickness of the thermal conductivity adjustment channel 141 may be 0.15 mm, 0.1 mm, 0.05 mm, and 0.03 mm.

Further, the thermal conductivity adjustment channel 141 is formed with a specific pattern shape and may be formed by a mono zone or a multi zone according to the specific pattern. For example, when the heater electrode 113 is configured by the mono zone, the thermal conductivity adjustment channel 141 is also configured by a mono zone and when the heater electrode 113 is configured by the multi zone, the thermal conductivity adjustment channel 141 is also configured by a multi zone.

To be more specific, the thermal conductivity adjustment channel 141 includes a plurality of thermal conductivity adjustment sub channels and adjusts the thermal conductivity for every thermal conductivity adjustment sub channel based on a pressure formed by the thermal conductivity adjustment gas supplied to the plurality of thermal conductivity adjustment sub channels by the adjustment gas supply unit 142.

Further, the thermal conductivity adjustment channel 141 includes a plurality of thermal conductivity adjustment sub channels which is spaced apart from each other by a partition and the thermal conductivity adjustment gas is supplied for every thermal conductivity adjustment sub channel by the adjustment gas supply unit 142. For example, the thermal conductivity adjustment channel 141 includes a first thermal conductivity adjustment sub channel and a second thermal conductivity adjustment sub channel which are spaced apart from each other by a partition. Here, the first thermal conductivity adjustment sub channel is formed with a donut shape. The second thermal conductivity adjustment sub channel is formed with a circular shape which is spaced apart from the inside of the first thermal conductivity adjustment sub channel with the partition therebetween. When the diameter of the substrate 200 is 300 mm, a diameter of the first thermal conductivity adjustment sub channel is between 200 mm and 330 mm, a diameter of the second thermal conductivity adjustment sub channel is between 150 mm and 250 mm, and a diameter of the partition is between 1 mm and 10 mm.

Further, the thermal conductivity adjustment channel 141 includes a plurality of thermal conductivity adjustment sub channels with different thicknesses. For example, the thermal conductivity adjustment channel 141 includes a first thermal conductivity adjustment sub channel and a second thermal conductivity adjustment sub channel which are spaced apart from each other by a partition. Here, the first thermal conductivity adjustment sub channel is formed with a donut shape. The second thermal conductivity adjustment sub channel has a thickness larger than that of the first thermal conductivity adjustment sub channel and is formed with a circular shape which is spaced apart from the inside of the first thermal conductivity adjustment sub channel with the partition therebetween.

Further, the thermal conductivity adjustment channel 141 includes a plurality of thermal conductivity adjustment sub channels which is connected to each other by a connection pipe with an orifice shape.

Further, the thermal conductivity adjustment channel 141 includes the first thermal conductivity adjustment sub channel disposed on the refrigerant channel 143 and the second thermal conductivity adjustment sub channel extending from an outer end of the first thermal conductivity adjustment sub channel to the refrigerant channel 143 to be spaced apart from the outside of the refrigerant channel 143.

In summary, the thermal conductivity adjustment channel 141 according to the present invention may be implemented in various forms by at least one configuration among "a configuration in which the thermal conductivity adjustment channel 141 is formed by a plurality of thermal conductivity adjustment sub channels", "a configuration in which a plurality of thermal conductivity adjustment sub channels which configures the thermal conductivity adjustment channel 141 is spaced apart from each other by the partition", "a configuration in which the plurality of thermal conductivity adjustment sub channels which configures the thermal conductivity adjustment channel 141 has different thicknesses, "a configuration in which the plurality of thermal conductivity adjustment sub channels which configures the thermal conductivity adjustment channel 141 is connected to each other by a connection pipe with an orifice shape, and "a configuration in which the thermal conductivity adjustment channel 141 is formed to enclose an outside of the refrigerant channel 143. An implementation example of the thermal conductivity adjustment channel 141 according to the present invention will be described in detail below.

In the meantime, when the thermal conductivity adjustment channel 141 according to the present invention is formed by a plurality of thermal conductivity adjustment sub channels, the chucking electrode 111 buried in the substrate holder 110, the heater electrode 113 buried in the substrate holder 110, and the refrigerant channel 143 buried in the body 140 are formed in plural so as to correspond to each of the plurality of thermal conductivity adjustment sub channels. For example, the chucking electrode 111 includes a plurality of chucking sub electrodes corresponding to the plurality of thermal conductivity adjustment sub channels which configures the thermal conductivity adjustment channel 141 and the chucking power supply unit 112 applies the power for every chucking sub electrode. For example, the heater electrode 113 includes a plurality of heater sub electrodes corresponding to the plurality of thermal conductivity adjustment sub channels which configures the thermal conductivity adjustment channel 141 and the heater power supply unit 114 applies the power for every heater sub electrode. For example, the refrigerant channel 143 includes a plurality of refrigerant sub channels corresponding to the plurality of thermal conductivity adjustment sub channels which configures the thermal conductivity adjustment channel 141 and the refrigerant supply unit 144 supplies the refrigerant for every refrigerant sub channel.

That is, in order to control the temperature of the substrate holder 110, the temperature uniformity of the substrate holder 110, the temperature of the substrate 200, and the temperature uniformity of the substrate 200, the refrigerant channel 143 is buried in the body 143 formed of the metal matrix composite (MMC) and includes an internal space in which the refrigerant supplied from the refrigerant supply unit 144 configured by the cryogenic chiller, a $LN_2$ dewar, and a $LN_2$ circulation supply system flows. The refrigerant may be galden or liquid nitrogen $LN_2$ and is supplied to the internal space of the refrigerant channel 143 through the refrigerant supply unit 144.

Here, the refrigerant channel 143 may be formed with a specific pattern (for example, spiral, serial, or parallel).

Further, the refrigerant channel 143 may be disposed below the thermal conductivity adjustment channel 141.

The lower bonding unit 160 is located below the body 140 to be bonded to the body 140.

That is, the lower bonding unit 160 is electrically connected to the body 140 with a low resistance and is mechanically bonded to the body 140.

The lower bonding unit 160 is configured by a first lower bonding unit 161 and a second lower bonding unit 162. At this time, the first lower bonding unit 161 of the lower bonding unit 160 is formed using vacuum brazing and epoxy. The first lower bonding unit 161 of the lower bonding unit 160 may be formed using the same method as a method of forming the first upper bonding unit 131 or/and the third upper bonding unit 133 of the upper bonding unit 130 which has been described above.

Further, the first lower bonding unit 161 may be formed of a material such as Al-based alloy (for example, Al-10Si-1.5Mg).

The second lower bonding unit 162 is disposed below the first lower bonding unit 161 and is electrically connected to the body 140 by the first lower bonding unit 161 with a low resistance and is mechanically bonded thereto.

Here, the second lower bonding unit 162 is formed of material such as molybdenum (Mo), Koval, zirconium (Zr), tungsten (W), titanium (Ti), niobium (Nb), platinum (Pt), or vanadium (V).

Further, the diameter of the second lower bonding unit 162 is equal to or smaller than the diameter of the body 140 or larger than the diameter of the body 140. Desirably, the diameter of the second lower bonding unit 162 is equal to the diameter of the body 140.

Further, the thickness of the second lower bonding unit 162 is determined based on the economic efficiency, and for example, 3 mm, 0.5 mm, and 0.05 mm.

An RF power supply unit 190 and an RF power matching unit 180 are electrically connected to the body 140 formed of metal matrix composite (MMC).

That is, the RF power supply unit 190 and the RF power matching unit 180 generate plasma in the processing area 600.

Here, in order to desirably process (for example, etch) the substrate 200, two or more RF power supply units 190 may be provided. For example, when two RF power supply units 190 are provided, a first RF power supply unit 190-1 of 13.56 MHz or higher (for example, 27.12 MHz, 40 MHz, and 60 MHz) and a second RF power supply unit 190-2 of lower than 13.56 MHz (for example, 2 MHz and 400 kHz). When a plurality of RF power supply units 190 is provided, a plurality of RF power matching units 180 may also be provided in response thereto.

A temperature measuring unit 150 measures the temperature and the temperature uniformity of the substrate 200 by measuring a temperature of the substrate holding unit 110, a temperature uniformity of the substrate holding unit 110, a temperature on the thermal conductivity adjustment channel 141 buried in the body 140, and the temperature uniformity on the thermal conductivity adjustment channel 141 buried in the body 140.

Here, the temperature measuring unit 150 may be configured by a thermocouple (TC) configured together with a fluoroptic thermometry or a filter and a control module (for example, PID).

When the temperature and the temperature uniformity are measured using the temperature measuring unit 150, a temperature measuring position may be a mono zone or a multi zone. The temperature measuring position may be determined based on the mono zone or the multi zone of the heater electrode 113 buried in the substrate holding unit 110. The temperature measuring position may be determined based on the mono zone or multi zone of the thermal conductivity adjustment channel 141 buried in the body 140.

The controller controls the temperature of the substrate 200 and the temperature uniformity of the substrate 200.

That is, the controller measures the temperature of the substrate holder 110, the temperature uniformity of the substrate holder 110, a temperature on the thermal conductivity adjustment channel 141, and a temperature uniformity on the thermal conductivity adjustment channel 141 by means of the temperature measuring unit 150.

The controller adjusts an amount and/or a pressure of a thermal conductivity adjustment gas supplied to the thermal conductivity adjustment channel 141 by the adjustment gas supply unit 142, based on measured temperature information (the temperature of the substrate holder 110, the temperature uniformity of the substrate holder 110, the temperature on the thermal conductivity adjustment channel 141, and the temperature uniformity on the thermal conductivity adjustment channel 141), a thermal conductivity graph according to a pressure, a target temperature, and a target temperature uniformity, to control the temperature of the substrate 200 and the temperature uniformity of the substrate 200.

Here, the thermal conductivity graph according to the pressure represents a thermal conductivity of the thermal conductivity adjustment channel 141 which changes in accordance of a pressure change of the internal space of the thermal conductivity adjustment channel 141 and is acquired in advance to be stored. For example, the thermal conductivity graph according to the pressure is formed as a S-shaped curve in which when the pressure is 0, the thermal conductivity is close to 0 and the higher the pressure, the higher the thermal conductivity. At this time, the thermal conductivity graph according to the pressure is changed according to the thickness of the thermal conductivity adjustment channel 141 and the smaller the thickness, the higher the thermal conductivity at the same pressure.

At this time, in order to control the temperature of the substrate 200 and the temperature uniformity of the substrate 200, the controller additionally controls at least one of the heater power supply unit 114 connected to the heater electrode 113, the adjustment gas supply unit 142 connected to the thermal conductivity adjustment channel 141, the chucking power supply unit 112 connected to the chucking electrode 111, the substrate gas supply unit 120, the refrigerant supply unit 144 connected to the refrigerant channel 143, the RF power supply unit 190, and the RF power matching unit 180 based on the target temperature and the target temperature uniformity.

In the meantime, for the convenience of description of the present invention, detailed description of a connection unit of the chucking electrode 111 and the chucking power supply unit 112, a connection unit of the heater electrode 113 and the heater power supply unit 114, a substrate gas flow path in the substrate holder 110 and the body 140 of the substrate gas supplied to the empty space between the substrate holder 110 and the substrate 299 by the substrate gas supply unit 120, a refrigerant flow path in the body 140, a thermal conductivity adjustment gas flow path in the body 140 of the thermal conductivity adjustment gas supplied to the thermal conductivity adjustment channel 141 by the adjustment gas supply unit 142, a position and an area in which the temperature is measured by the temperature measuring unit 150, a vacuum system connected to the pumping connection unit 310 of the chamber 300, a processing gas supply source, a lift pin for transferring the substrate 200, an edge ring, an EMI gasket, and an O-ring which have been widely known in the related art will be omitted.

Now, an implementation example of a thermal conductivity adjustment configuration according to a preferred embodiment of the present invention will be described with reference to FIGS. 3 to 9.

Figure 3:
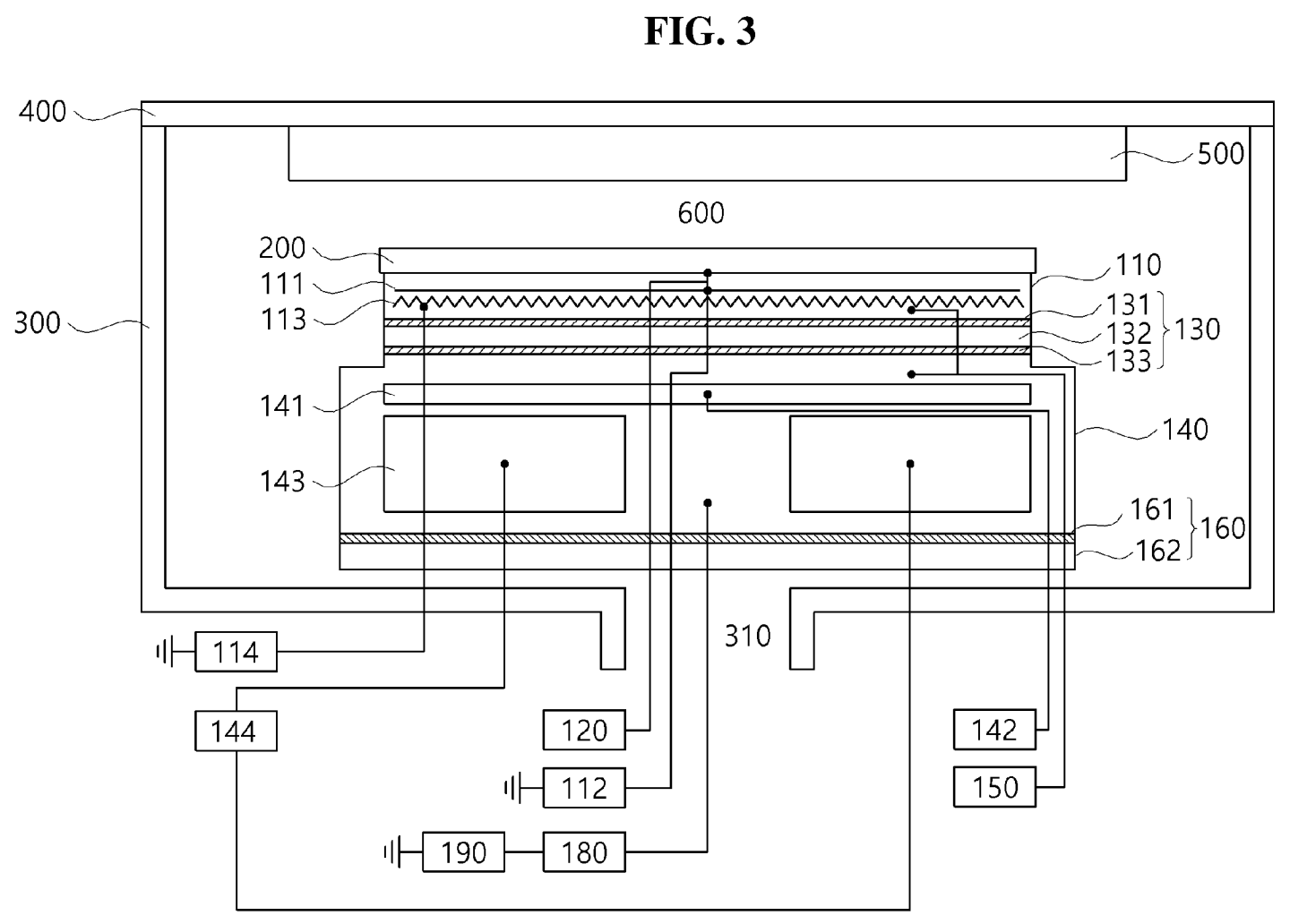

FIG. 3 is a view for explaining Example 1 of a cryogenic electrostatic chuck device illustrated in FIG. 2.

Referring to FIG. 3, a thermal conductivity adjustment channel 141 according to Example 1 of the cryogenic electrostatic chuck device 100 according to the present invention may be buried in the body 140. The thermal conductivity adjustment channel 141 adjusts the thermal conductivity based on a pressure formed by a thermal conductivity adjustment gas supplied by the adjustment gas supply unit 142.

At this time, the controller adjusts a thermal conductivity of the thermal conductivity adjustment channel 141 by adjusting an amount and/or a pressure of a thermal conductivity adjustment gas supplied to the thermal conductivity adjustment channel 141 by the adjustment gas supply unit 142, based on measured temperature information (the temperature of the substrate holder 110, the temperature uniformity of the substrate holder 110, the temperature on the thermal conductivity adjustment channel 141, and the temperature uniformity on the thermal conductivity adjustment channel 141), a thermal conductivity graph according to a pressure, a target temperature, and a target temperature uniformity, thereby finally controlling the temperature of the substrate 200 and the temperature uniformity of the substrate 200.

Figure 4:
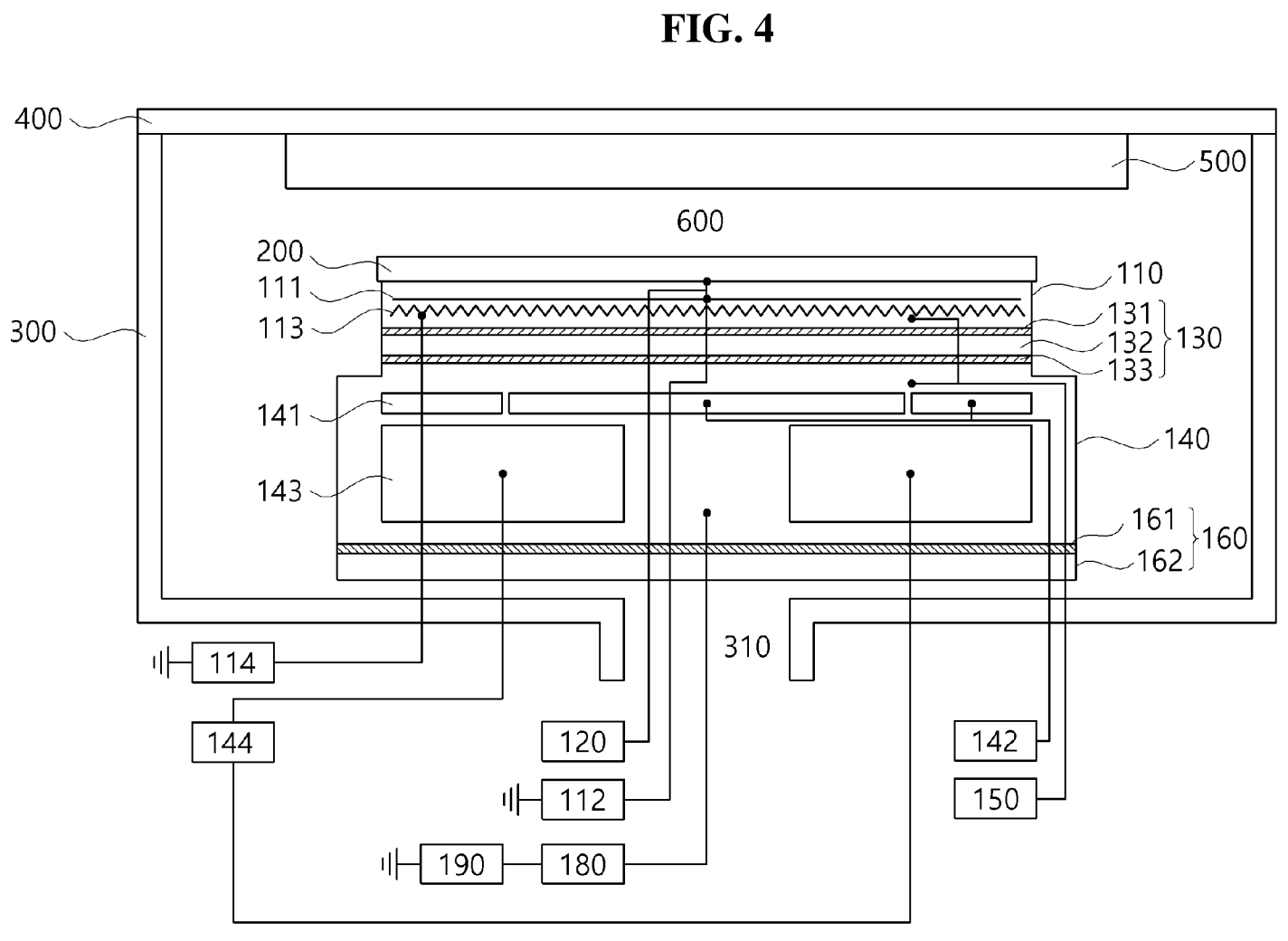

FIG. 4 is a view for explaining Example 2 of a cryogenic electrostatic chuck device illustrated in FIG. 2.

Referring to FIG. 4, the thermal conductivity adjustment channel 141 according to Example 2 of the cryogenic electrostatic chuck device 100 according to the present invention includes a first thermal conductivity adjustment sub channel and a second thermal conductivity adjustment sub channel which are spaced apart from each other with a partition therebetween.

Here, a diameter of the substrate 200 is 300 mm and a diameter of the partition is between 1 mm and 10 mm.

The first thermal conductivity adjustment sub channel is formed with a donut shape and has a diameter between 200 mm and 330 mm.

The second thermal conductivity adjustment sub channel is formed with a circular shape which is spaced apart from the inside of the first thermal conductivity adjustment sub channel with the partition therebetween and has a diameter between 150 mm and 250 mm.

The thermal conductivity adjustment channel 141 adjusts the thermal conductivity for each of the first thermal conductivity adjustment sub channel and the second thermal conductivity adjustment sub channel. The adjustment gas supply unit 142 may adjust an amount and/or a pressure of the thermal conductivity adjustment gas supplied for each of the first thermal conductivity adjustment sub channel and the second thermal conductivity adjustment sub channel.

At this time, the controller adjusts a thermal conductivity for each of the first thermal conductivity adjustment sub channel and the second thermal conductivity adjustment sub channel by adjusting an amount and/or a pressure of a thermal conductivity adjustment gas supplied to the thermal conductivity adjustment channel 141 by the adjustment gas supply unit 142 for each of the first thermal conductivity adjustment sub channel and the second thermal conductivity adjustment sub channel, based on two temperature information (the temperature of the substrate holder 110, the temperature uniformity of the substrate holder 110, the temperature on the thermal conductivity adjustment channel 141, and the temperature uniformity on the thermal conductivity adjustment channel 141) measured in a position corresponding to each of the first thermal conductivity adjustment sub channel and the second thermal conductivity adjustment sub channel. a thermal conductivity graph according to a pressure, a target temperature, and a target temperature uniformity, thereby finally controlling the temperature of the substrate 200 and the temperature uniformity of the substrate 200.

That is, when the etching process of the substrate 200 is performed, a temperature of an edge area of the substrate 200 is higher than a temperature of a center area. Therefore, in order to individually control the temperature and the temperature uniformity of the center area and the edge area of the substrate 200, as described in the embodiment, the thermal conductivity adjustment channel 141 is configured by the second thermal conductivity adjustment sub channel corresponding to the center area of the substrate 200 and the first thermal conductivity adjustment sub channel corresponding to the edge area of the substrate 200 to control the thermal conductivity for each of the first thermal conductivity adjustment sub channel and the second thermal conductivity adjustment sub channel.

Figure 5:
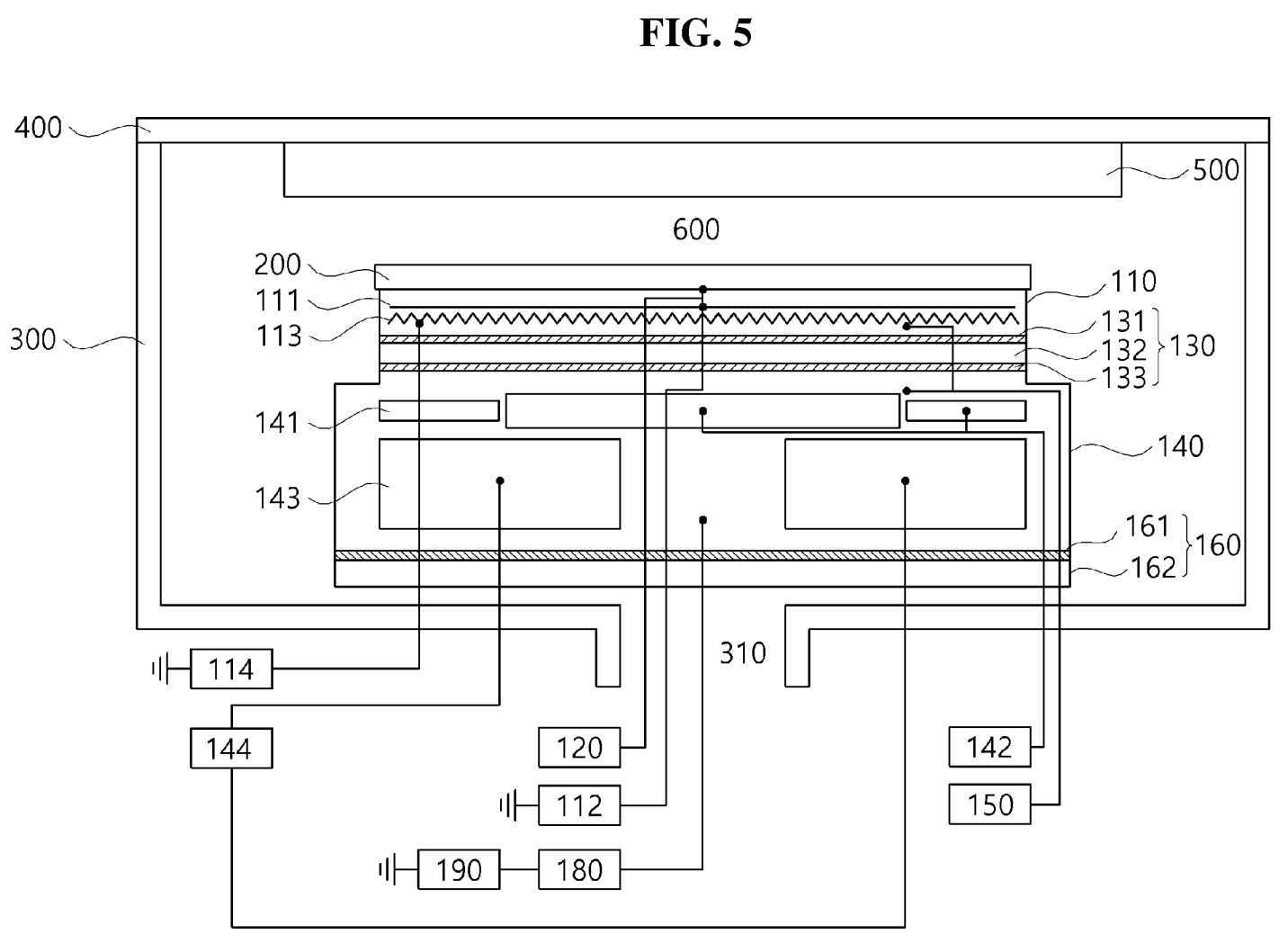

FIG. 5 is a view for explaining Example 3 of a cryogenic electrostatic chuck device illustrated in FIG. 2.

The thermal conductivity adjustment channel 141 according to Example 3 of the cryogenic electrostatic chuck device 100 according to the present invention is substantially the same as the thermal conductivity adjustment channel 141 according to Example 2 of the cryogenic electrostatic chuck device 100 according to the present invention (see FIG. 4) and only the difference will be described.

Referring to FIG. 5, the second thermal conductivity adjustment sub channel has a thickness larger than a thickness of the first thermal conductivity adjustment sub channel.

Here, a thickness of the first thermal conductivity adjustment sub channel is 0.05 mm.

Here, a thickness of the second thermal conductivity adjustment sub channel is 0.1 mm.

Figure 6:
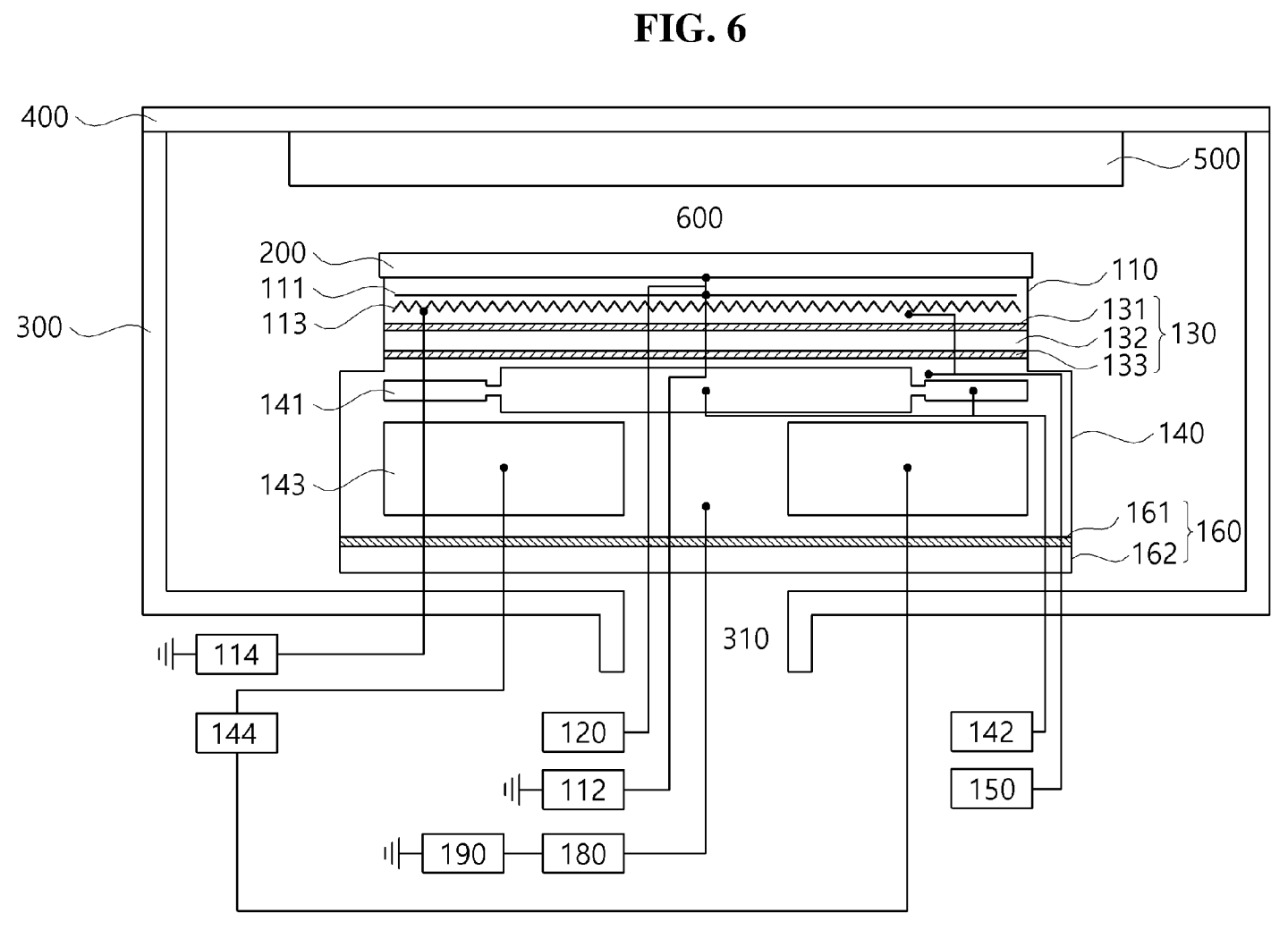

FIG. 6 is a view for explaining Example 4 of a cryogenic electrostatic chuck device illustrated in FIG. 2.

The thermal conductivity adjustment channel 141 according to Example 3 of the cryogenic electrostatic chuck device 100 according to the present invention is substantially the same as the thermal conductivity adjustment channel 141 according to Example 3 of the cryogenic electrostatic chuck device 100 according to the present invention (see FIG. 5) and only the difference will be described.

Referring to FIG. 6, the first thermal conductivity adjustment sub channel and the second thermal conductivity adjustment sub channel are connected to each other through a connection pipe with an orifice shape.

Here, the thickness of the connection pipe with an orifice shape is smaller than the thickness of the first thermal conductivity adjustment sub channel.

That is, in order to adjust the pressures of the first thermal conductivity adjustment sub channel and the second thermal conductivity adjustment sub channel to be different by generating the eddy current in each of the first thermal conductivity adjustment sub channel and the second thermal conductivity adjustment sub channel, the first thermal conductivity adjustment sub channel and the second thermal conductivity adjustment sub channel are connected through a connection pipe with an orifice shape.

Figure 7:
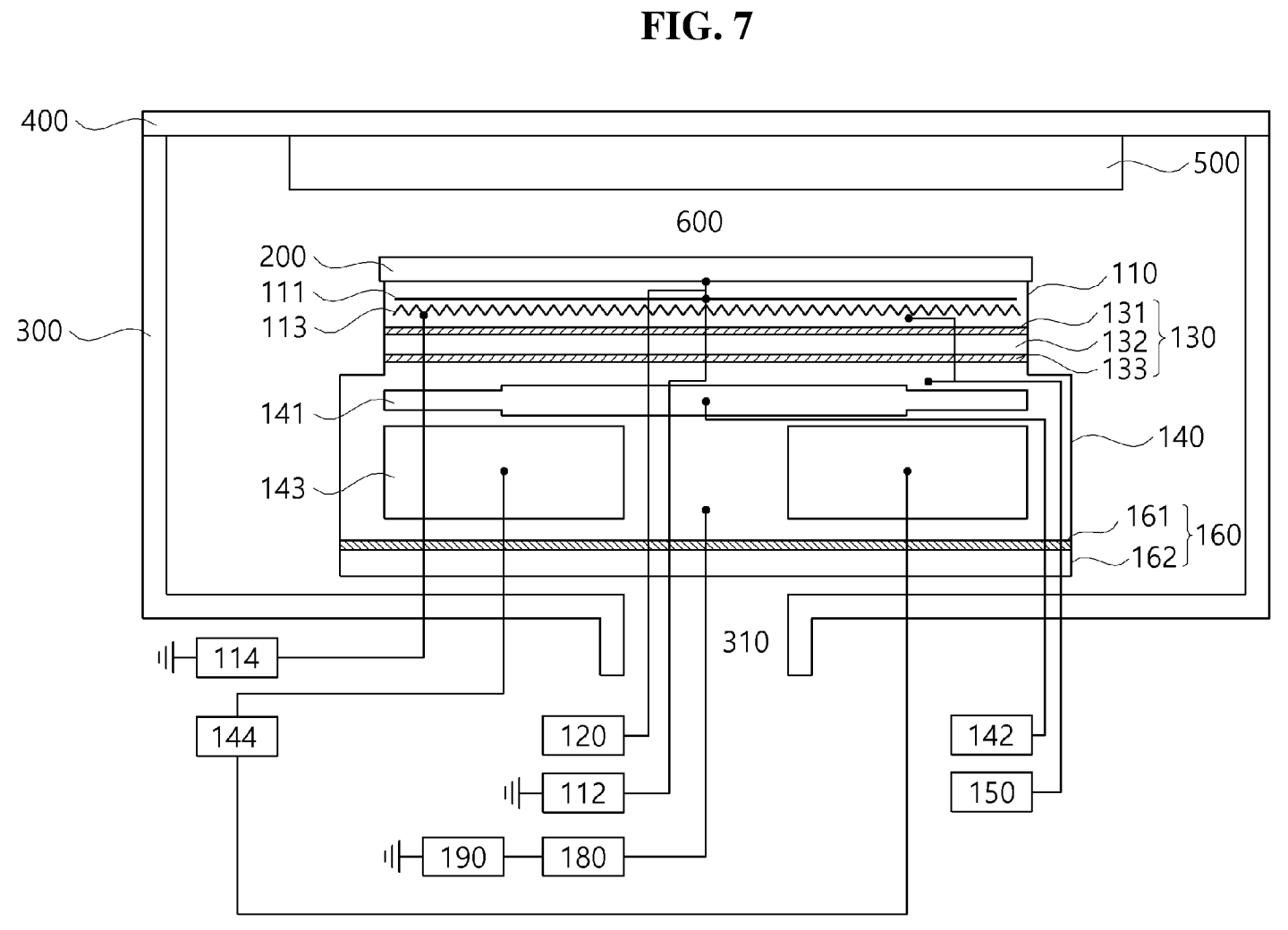

FIG. 7 is a view for explaining Example 5 of a cryogenic electrostatic chuck device illustrated in FIG. 2.

The thermal conductivity adjustment channel 141 according to Example 5 of the cryogenic electrostatic chuck device 100 according to the present invention is substantially the same as the thermal conductivity adjustment channel 141 according to Example 1 of the cryogenic electrostatic chuck device 100 according to the present invention (see FIG. 3) and only the difference will be described.

Referring to FIG. 7, the thickness of the thermal conductivity adjustment channel 141 according to the exemplary embodiment is not uniform as described in Example 1 illustrated in FIG. 3, but the thickness of the center area is larger than the thickness of the edge area.

That is, the thermal conductivity graph according to the pressure is changed according to the thickness of the thermal conductivity adjustment channel 141 and the smaller the thickness, the higher the thermal conductivity at the same pressure. Therefore, based on this, the thickness of the center area of the thermal conductivity adjustment channel 141 corresponding to the center area of the substrate 200 is formed to be larger than the thickness of the edge area of the thermal conductivity adjustment channel 141 corresponding to the edge area of the substrate 200.

Figure 8:
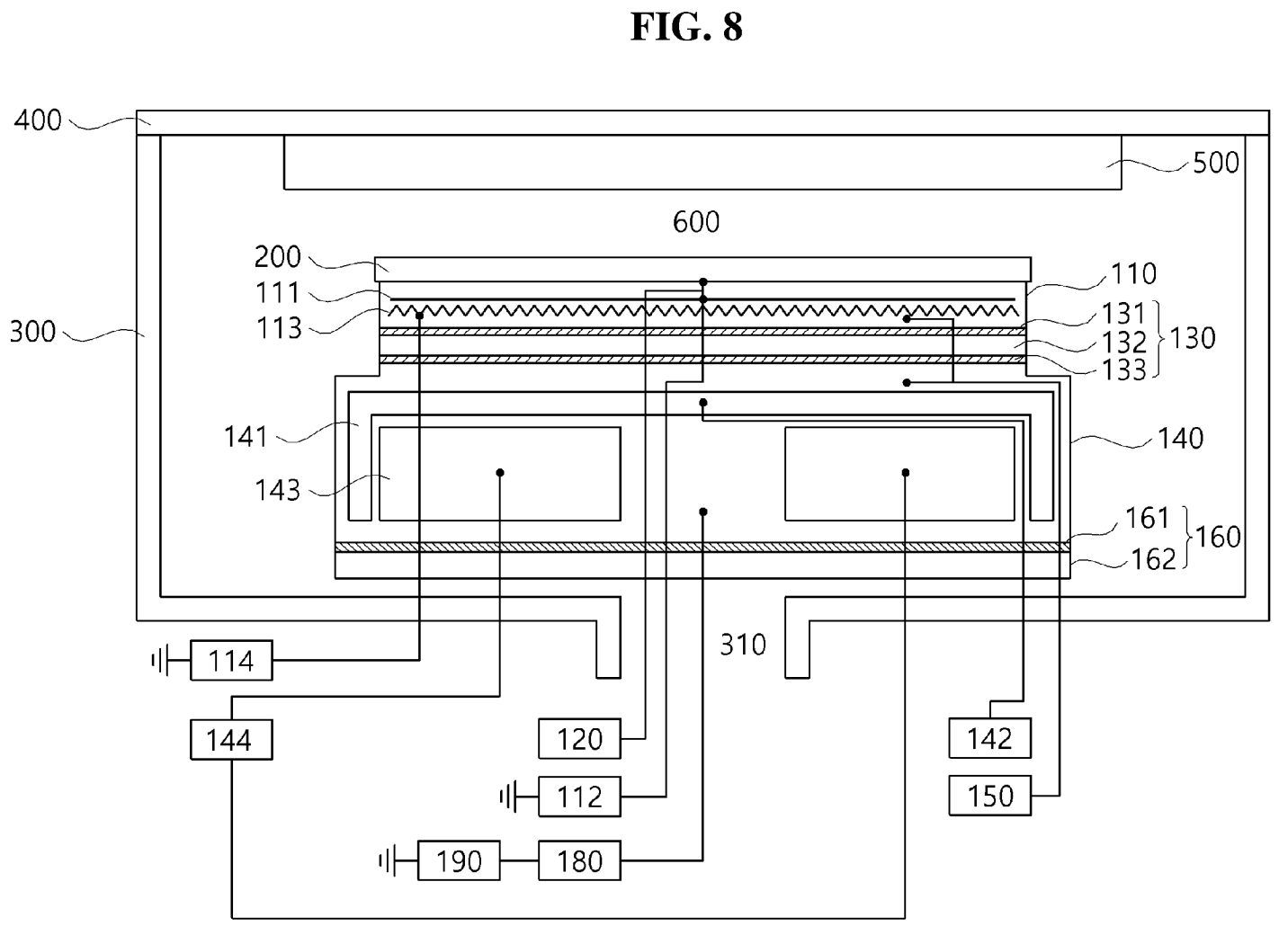

FIG. 8 is a view for explaining Example 6 of a cryogenic electrostatic chuck device illustrated in FIG. 2.

The thermal conductivity adjustment channel 141 according to Example 6 of the cryogenic electrostatic chuck device 100 according to the present invention is substantially the same as the thermal conductivity adjustment channel 141 according to Example 1 of the cryogenic electrostatic chuck device 100 according to the present invention (see FIG. 3) and only the difference will be described.

Referring to FIG. 8, the thermal conductivity adjustment channel 141 according to the present invention includes a first thermal conductivity adjustment sub channel which is a thermal conductivity adjustment channel 141 according to Example 1 illustrated in FIG. 3 and a second thermal conductivity adjustment sub channel extending from an outer end of the first thermal conductivity adjustment sub channel.

Here, the first thermal conductivity adjustment sub channel is disposed on the refrigerant channel 143.

The second thermal conductivity adjustment sub channel extends from the outer end of the first thermal conductivity adjustment sub channel to the refrigerant channel 143 to be spaced apart from the outside of the refrigerant channel 143.

In a part in which the first thermal conductivity adjustment sub channel and the second thermal conductivity adjustment sub channel are connected, an internal partition and a connection pipe with an orifice shape are formed to prevent the flow of the thermal conductivity adjustment between the first thermal conductivity adjustment sub channel and the second thermal conductivity adjustment sub channel.

At this time, the adjustment gas supply unit 142 supplies a thermal conductivity adjustment gas to the first thermal conductivity adjustment sub channel, but does not supply the thermal conductivity adjustment gas to the second thermal conductivity adjustment sub channel.

That is, the thermal conductivity adjustment gas is not supplied to the second thermal conductivity adjustment sub channel so that the pressure of the second thermal conductivity adjustment sub channel is 0 and thus the thermal conductivity of the second thermal conductivity adjustment sub channel is close to 0. Therefore, the outside of the refrigerant channel 143 may be insulated.

Figure 9:
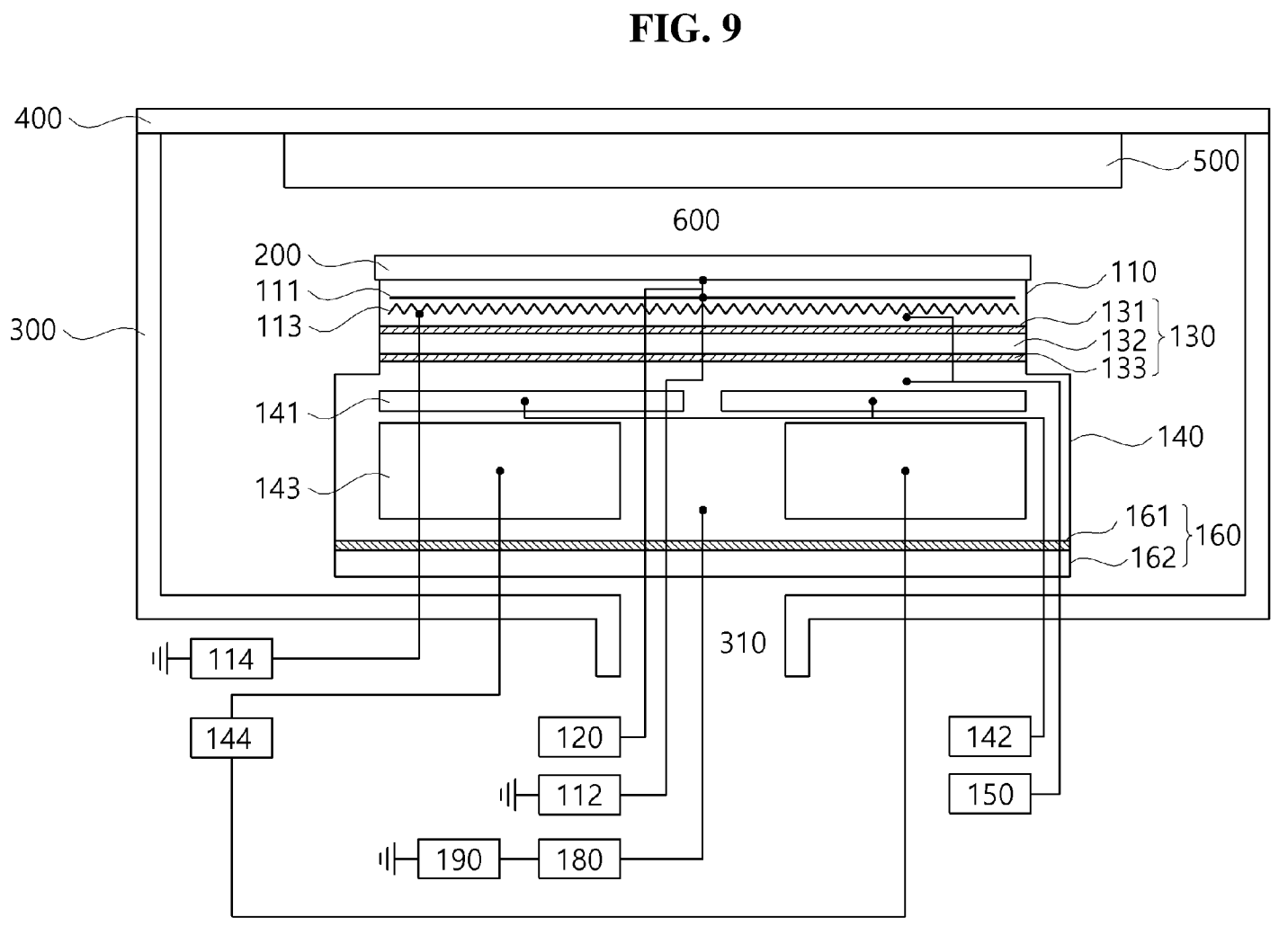

FIG. 9 is a view for explaining Example 7 of a cryogenic electrostatic chuck device illustrated in FIG. 2.

The thermal conductivity adjustment channel 141 according to Example 7 of the cryogenic electrostatic chuck device 100 according to the present invention is substantially the same as the thermal conductivity adjustment channel 141 according to Example 2 of the cryogenic electrostatic chuck device 100 according to the present invention (see FIG. 4) and only the difference will be described.

Referring to FIG. 9, the thermal conductivity adjustment channel 141 according to the present embodiment includes a first thermal conductivity adjustment sub channel and a second thermal conductivity adjustment sub channel which are spaced apart from each other by a partition.

Here, the first thermal conductivity adjustment sub channel and the second thermal conductivity adjustment sub channel are formed in a semi-circular shape.

Now, an implementation example of an RF power supply configuration according to a preferred embodiment of the present invention will be described with reference to FIGS. 10 to 12.

Figure 10:
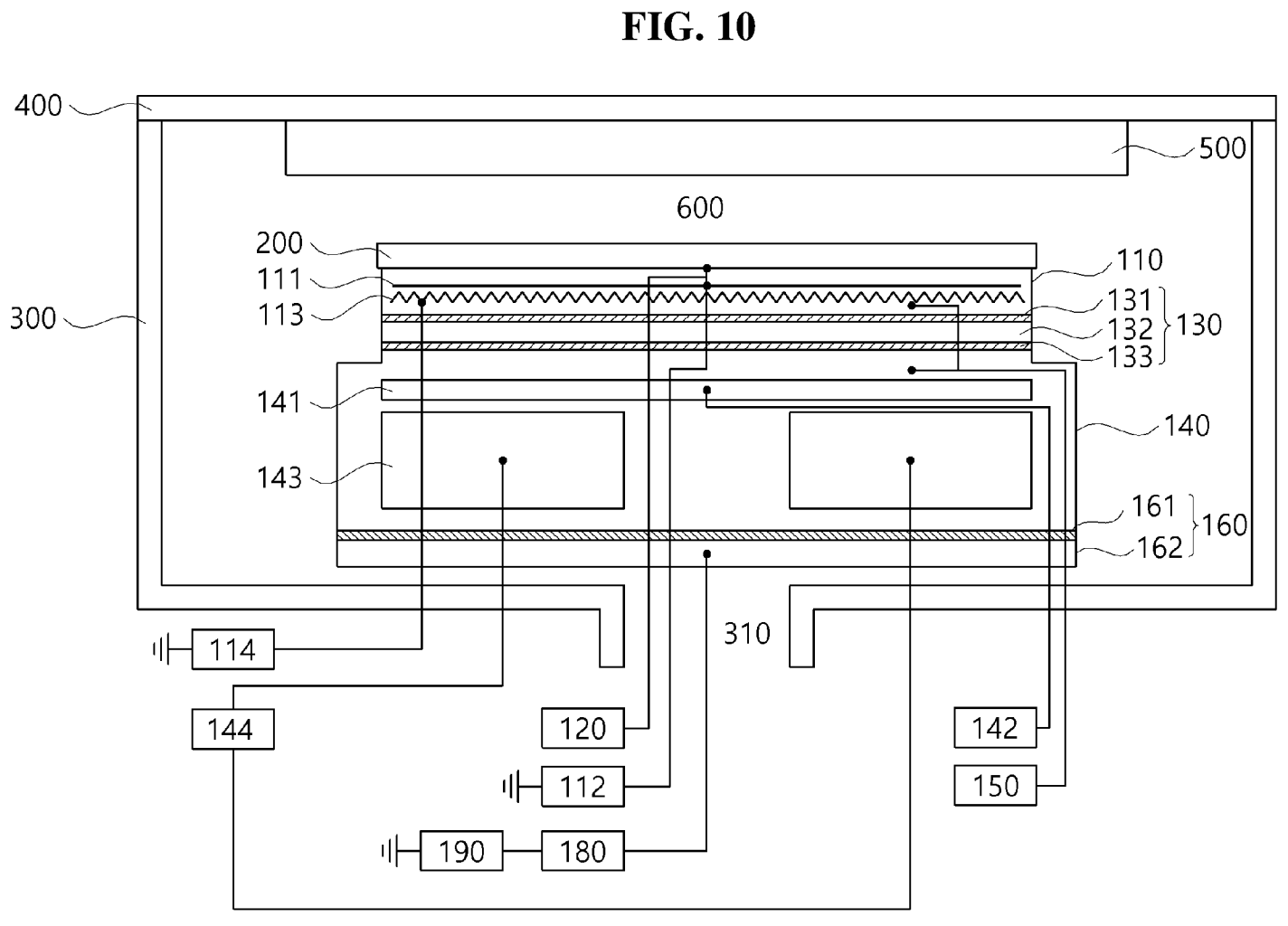
Figure 11:
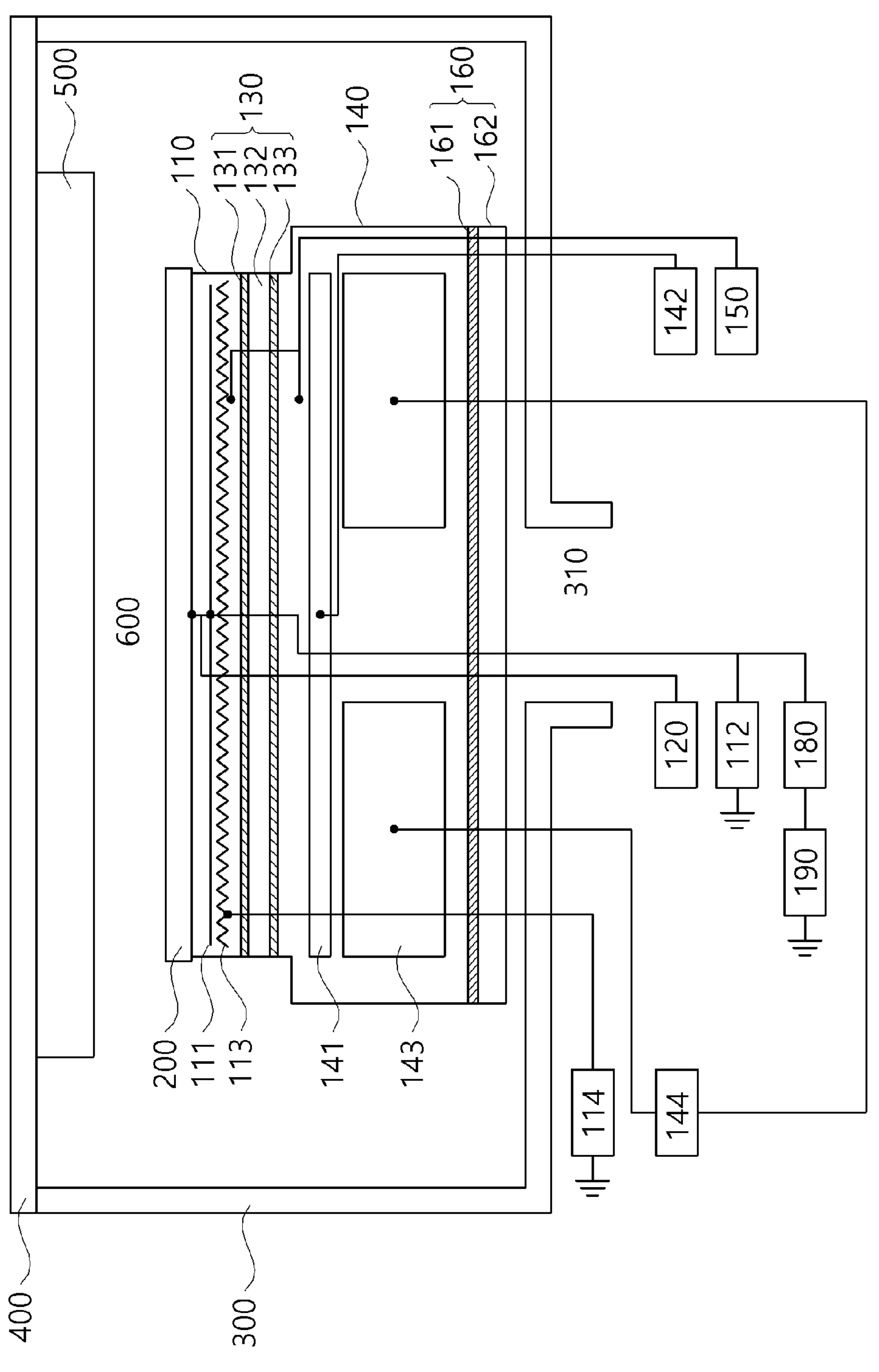
FIG. 11 is a view for explaining still another example of an RF power supply configuration of a cryogenic electrostatic chuck device illustrated in FIG. 2.
Figure 12:
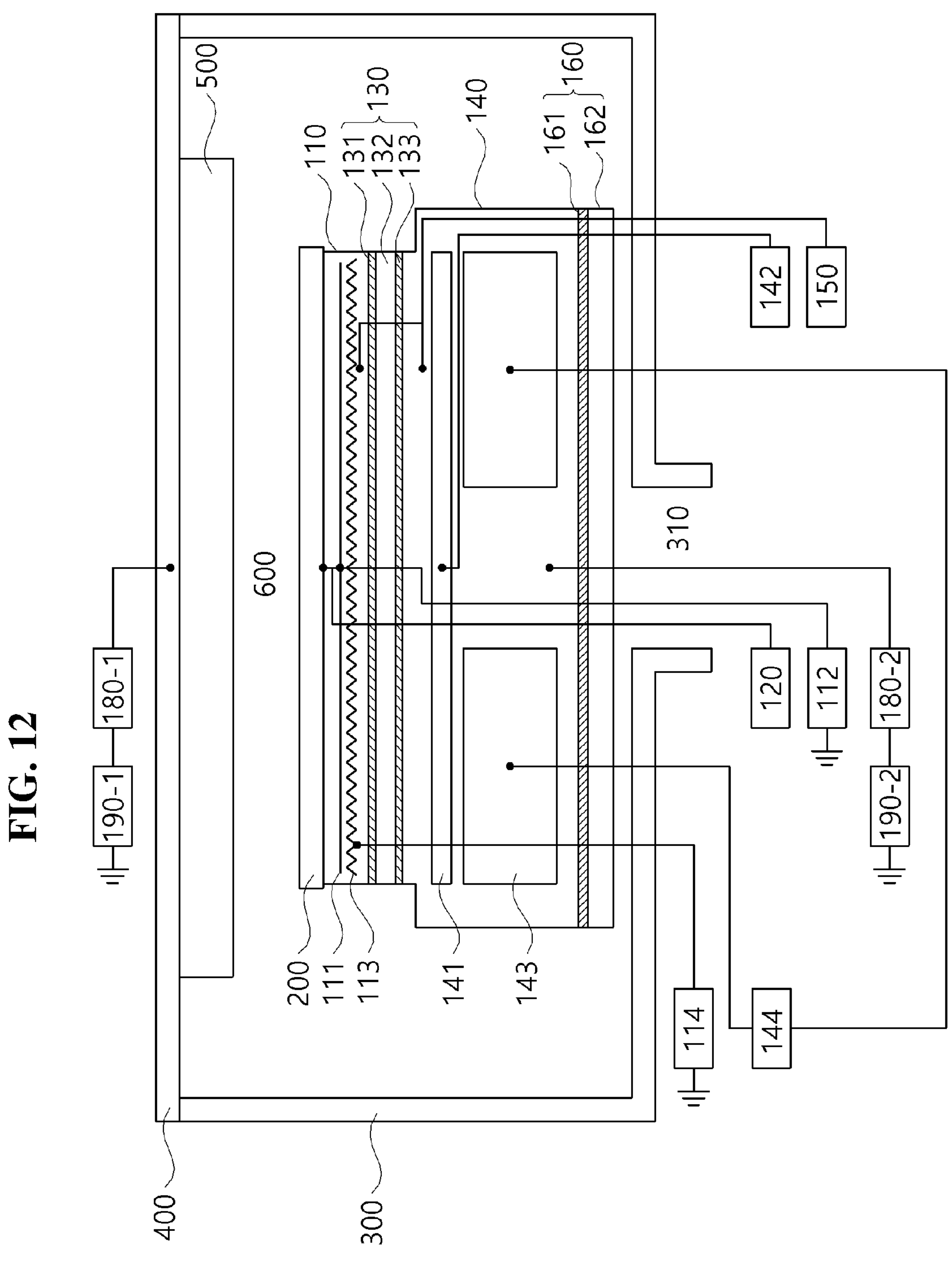
FIG. 12 is a view for explaining still another example of an RF power supply configuration of a cryogenic electrostatic chuck device illustrated in FIG. 2.

FIG. 10 is a view for explaining another example of an RF power supply configuration of a cryogenic electrostatic chuck device illustrated in FIG. 2, FIG. 11 is a view for explaining still another example of an RF power supply configuration of a cryogenic electrostatic chuck device illustrated in FIG. 2, and FIG. 12 is a view for explaining still another example of an RF power supply configuration of a cryogenic electrostatic chuck device illustrated in FIG. 2.

An RF power supply unit 190 and an RF power matching unit 180 according to the present invention are electrically connected to the body 140 formed of metal matrix composite (MMC).

That is, the RF power supply unit 190 and the RF power matching unit 180 according to the present invention are electrically connected to the body 140, as illustrated in FIG. 3.

Further, the RF power supply unit 190 and the RF power matching unit 180 according to the present invention are electrically connected to the lower bonding unit 160, as illustrated in FIG. 10.

Further, the RF power supply unit 190 and the RF power matching unit 180 according to the present invention are electrically connected to the chucking electrode 111, as illustrated in FIG. 11.

Further, two RF power supply units 190 and two RF power matching units 180 according to the present invention may be provided and a second RF power supply unit 190-2 and a second RF power matching unit 180-2 are electrically connected to the body 140 and a first RF power supply unit 190-1 and a first RF power matching unit 180-1 are electrically connected to the plasma supply device 400.

Now, a method for controlling a cryogenic electrostatic chuck device according to a preferred embodiment of the present invention will be described in more detail with reference to FIG. 13.

Figure 13:
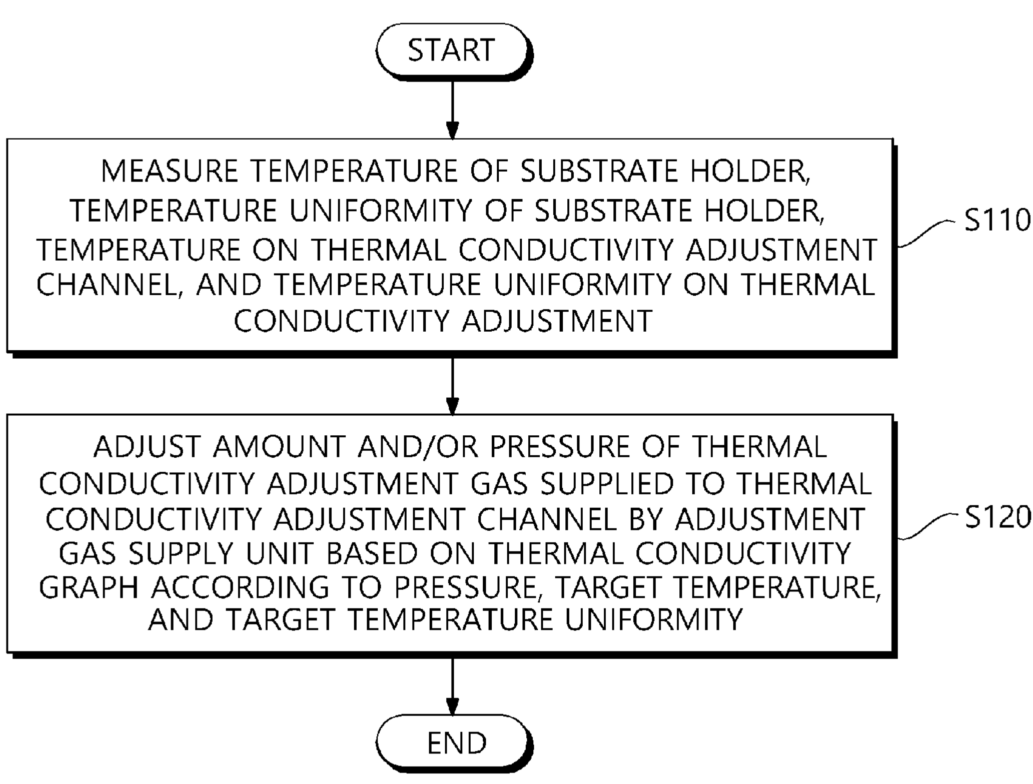
FIG. 13 is a flowchart for explaining a method for controlling a cryogenic electrostatic chuck device according to a preferred embodiment of the present invention.

FIG. 13 is a flowchart for explaining a method for controlling a cryogenic electrostatic chuck device according to a preferred embodiment of the present invention.

Referring to FIG. 13, a controller of a cryogenic electrostatic chuck device 100 according to a preferred embodiment of the present invention measures a temperature of the substrate holder 110, a temperature uniformity of the substrate holder 110, a temperature on the thermal conductivity adjustment channel 141, and a temperature uniformity on the thermal conductivity adjustment channel 141 (S110).

Next, the controller of the cryogenic electrostatic chuck device 100 adjusts an amount and/or a pressure of a thermal conductivity adjustment gas supplied to the thermal conductivity adjustment channel 141 by the adjustment gas supply unit 142, based on measured temperature information (the temperature of the substrate holder 110, the temperature uniformity of the substrate holder 110, the temperature on the thermal conductivity adjustment channel 141, and the temperature uniformity on the thermal conductivity adjustment channel 141), a thermal conductivity graph according to a pressure, a target temperature, and a target temperature uniformity (S120).

Here, the thermal conductivity graph according to the pressure represents a thermal conductivity of the thermal conductivity adjustment channel 141 which changes in accordance of a pressure change of the internal space of the thermal conductivity adjustment channel 141 and is acquired in advance to be stored. For example, the thermal conductivity graph according to the pressure is formed as a S-shaped curve in which when the pressure is 0, the thermal conductivity is close to 0 and the higher the pressure, the higher the thermal conductivity. At this time, the thermal conductivity graph according to the pressure is changed according to the thickness of the thermal conductivity adjustment channel 141 and the smaller the thickness, the higher the thermal conductivity at the same pressure.

At this time, in order to control the temperature of the substrate 200 and the temperature uniformity of the substrate 200, the controller additionally controls at least one of the heater power supply unit 114 connected to the heater electrode 113, the adjustment gas supply unit 142 connected to the thermal conductivity adjustment channel 141, the chucking power supply unit 112 connected to the chucking electrode 111, the substrate gas supply unit 120, the refrigerant supply unit 144 connected to the refrigerant channel 143, the RF power supply unit 190, and the RF power matching unit 180 based on the target temperature and the target temperature uniformity.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardwares. Further, such a computer program may be stored in a computer readable media such as a USB memory, a CD disk, or a flash memory to be read and executed by a computer to implement the exemplary embodiment of the present invention. The recording media of the computer program may include a magnetic recording medium or an optical recording medium.

The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit is not limited by the exemplary embodiments and accompanying drawings. The protective scope of the present invention should be construed based on the following claims, and all the technical concepts in the equivalent scope thereof should be construed as falling within the scope of the present invention.

| <Explanation of Reference Numerals and Symbols> | |
|---|---|
| 10: Cryogenic electrostatic chuck system | |
| 100: Cryogenic electrostatic chuck device | |
| 110: Substrate holder | 111: Chucking electrode |
| 112: Chucking power supply unit | 113: Heater electrode |
| 114: Heater power supply unit | 120: Substrate gas supply unit |
| 130: Upper bonding unit | 131: First upper bonding unit |
| 132: Second upper bonding unit | 133: Third upper bonding unit |
| 140: Body | |
| 141: Thermal conductivity adjustment channel | |
| 142: Adjustment gas supply unit | 143: Refrigerant channel |
| 144: Refrigerant supply unit | |
| 150: Temperature measurement unit | |
| 160: Lower bonding unit | 161: First lower bonding unit |
| 162: Second lower bonding unit | 180: RF power matching unit |
| 190: RF power supply unit | 200: Substrate |
| 300: Chamber | 310: Pumping connection unit |
| 400: Plasma supply device | |
| 500: Processing gas supply device | |
| 600: Processing area | |

The invention claimed is:

1. A cryogenic electrostatic chuck device, comprising:

a substrate holder which fixes a substrate by an electrostatic force; and a body which is disposed below the substrate holder and includes a thermal conductivity adjustment channel which is formed of a metal based material determined based on a coefficient of thermal expansion (CTE) of the substrate holder and adjusts a thermal conductivity based on a pressure formed by a thermal conductivity adjustment gas supplied by an adjustment gas supply unit, wherein the thermal conductivity adjustment channel includes a plurality of thermal conductivity adjustment sub channels and a thermal conductivity is adjusted for every thermal conductivity adjustment sub channel based on a pressure formed by the thermal conductivity adjustment gas supplied to the plurality of thermal conductivity adjustment sub channels by the adjustment gas supply unit.

2. The cryogenic electrostatic chuck device of claim 1, wherein the thermal conductivity adjustment channel includes a plurality of thermal conductivity adjustment sub channels which is spaced apart from each other with a partition therebetween and the thermal conductivity adjustment gas is supplied for every thermal conductivity adjustment sub channel by the adjustment gas supply unit.

3. The cryogenic electrostatic chuck device of claim 2, wherein the thermal conductivity adjustment channel includes a first thermal conductivity adjustment sub channel and a second thermal conductivity adjustment sub channel which are spaced apart from each other with a partition therebetween and the first thermal conductivity adjustment sub channel is formed with a donut shape, and the second thermal conductivity adjustment sub channel is formed with a circular shape which is spaced apart from the inside of the first thermal conductivity adjustment sub channel with the partition therebetween.

4. The cryogenic electrostatic chuck device of claim 3, wherein a diameter of the first thermal conductivity adjustment sub channel is between 200 mm and 330 mm, a diameter of the second thermal conductivity adjustment sub channel is between 150 mm and 250 mm, and a diameter of the partition is between 1 mm and 10 mm.

5. The cryogenic electrostatic chuck device of claim 2, wherein the thermal conductivity adjustment channel includes a plurality of thermal conductivity adjustment sub channels having different thicknesses.

6. The cryogenic electrostatic chuck device of claim 5, wherein the thermal conductivity adjustment channel includes a first thermal conductivity adjustment sub channel and a second thermal conductivity adjustment sub channel which are spaced apart from each other with a partition therebetween, the first thermal conductivity adjustment sub channel is formed with a donut shape, and the second thermal conductivity adjustment sub channel has a thickness larger than the thickness of the first thermal conductivity adjustment sub channel and is formed with a circular shape which is spaced apart from the inside of the first thermal conductivity adjustment sub channel with the partition therebetween.

7. The cryogenic electrostatic chuck device of claim 2, wherein the thermal conductivity adjustment channel includes a plurality of thermal conductivity adjustment sub channels which is connected to each other by means of a connection pipe with an orifice shape.

8. The cryogenic electrostatic chuck device of claim 2, wherein the thermal conductivity adjustment channel includes a first thermal conductivity adjustment sub channel disposed on a refrigerant channel and a second thermal conductivity adjustment sub channel which extends from an outer end of a first thermal conductivity adjustment sub channel to the refrigerant channel to be spaced apart from the outside of the refrigerant channel.

9. The cryogenic electrostatic chuck device of claim 1, wherein a diameter of the substrate holder is equal to or smaller than a diameter of the substrate and a diameter of the body is equal to or larger than a diameter of the substrate.

10. The cryogenic electrostatic chuck device of claim 1, further comprising:

an upper bonding unit which is located between the substrate holder and the body and bonds the substrate holder and the body; and a lower bonding unit which is located below the body to be bonded to the body.

11. The cryogenic electrostatic chuck device of claim 1, wherein the metal based material is a metal matrix composite (MMC) which is one of Al—SiC and Al—Si.

* * * * *